United States Patent [19]

Sakashita et al.

[11] Patent Number: 4,780,909
[45] Date of Patent: Oct. 25, 1988

[54] SIGNAL RECEIVER HAVING AUTOMATIC FREQUENCY CHARACTERISTIC ADJUSTING CAPABILITY

[75] Inventors: Seiji Sakashita, Yawata; Kiyotake Fukui, Settsu, both of Japan

[73] Assignee: Matsushita Electric Industrial Co. Ltd., Osaka, Japan

[21] Appl. No.: 877,451

[22] Filed: Jun. 23, 1986

[30] Foreign Application Priority Data

Jul. 2, 1985 [JP] Japan .................................. 60-145505
Jul. 2, 1985 [JP] Japan .................................. 60-145513

[51] Int. Cl.[4] .............................................. H04B 1/26
[52] U.S. Cl. .................................... 455/161; 455/164; 455/185; 455/186; 455/340
[58] Field of Search ............... 455/161, 164, 185, 186, 455/197, 200, 340

[56] References Cited

U.S. PATENT DOCUMENTS

| | | | |
|---|---|---|---|
| 4,334,323 | 6/1982 | Moore | 455/186 |
| 4,355,414 | 10/1982 | Inoue | 455/200 |
| 4,590,611 | 5/1986 | Maier et al. | 455/186 |
| 4,654,884 | 3/1987 | Sakai et al. | 455/200 |

FOREIGN PATENT DOCUMENTS 58-18008  4/1983  Japan .

OTHER PUBLICATIONS

"Computer Controlled Television Channel Selection and Tuner Alignment", by Daniel Dumont and Arno Neelen; IEEE ICCE85 Session V-TV Signal Processing II, Digest of Tehnical Papers, Jun. 1985, pp. 78-79.

*Primary Examiner*—Michael A. Masnick
*Attorney, Agent, or Firm*—Wenderoth, Lind & Ponack

[57] ABSTRACT

A signal receiver generates a reference signal that sweeps frequencies of desired channel bands, and then feeds the reference signal to an input terminal of receiver unit via a signal-switching circuit that performs switching of the desired-channel signal and the reference signal. The signal receiver then detects the signal strength present in plural frequencies of intermediate frequencies delivered to an output terminal of the reference signal, and after storing detected signal data in a memory, the signal receiver compares the detected signal data to desired frequency characteristics. Then, the signal receiver determines tuning voltages of respective tuning circuits so that the differences which arose from the comparison can be minimized. After determining the tuning voltages, these voltages are delivered to respective tuning circuits, and then a switching operation between the reference signal and the desired channel signal is executed before the signal receiver eventually receives the switched signal.

18 Claims, 19 Drawing Sheets

| FLATNESS COMPARISON \ MAXIMUM VALUE COMPARISON | | | N-th LARGE | (N+1)-th SMALL | N-th SMALL | (N+1)-th LARGE |
|---|---|---|---|---|---|---|
| ID STEP 1 | N-th | OK | N-th | | N-th | |
| | | NG | TO ID STEP 2 | | TO ID STEP 2 | |
| ID STEP 2 | (N+1)-th | OK | N-th | | (N+1)-th | |
| | | NG | TUNING VOLTAGE FINE VARIATION | | TUNING VOLTAGE FINE VARIATION | |

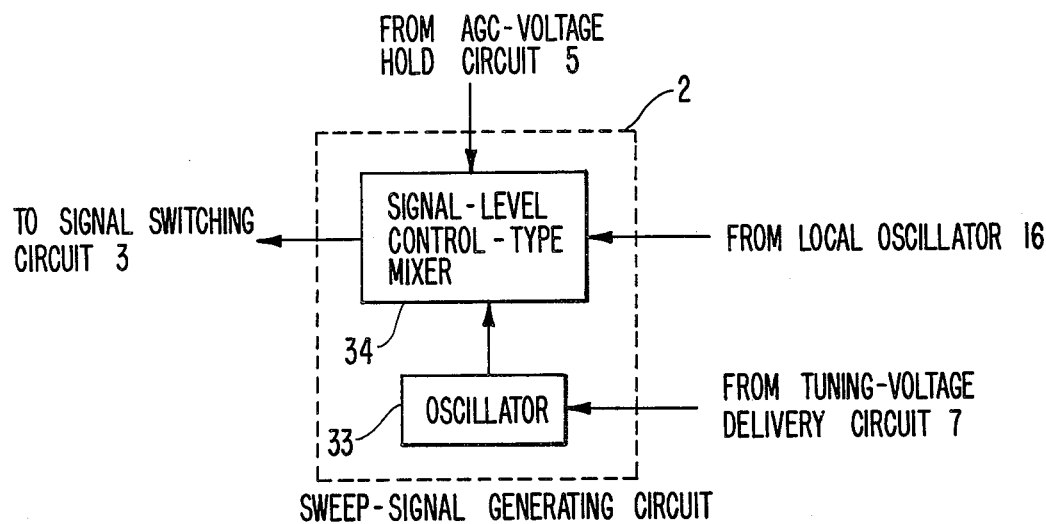
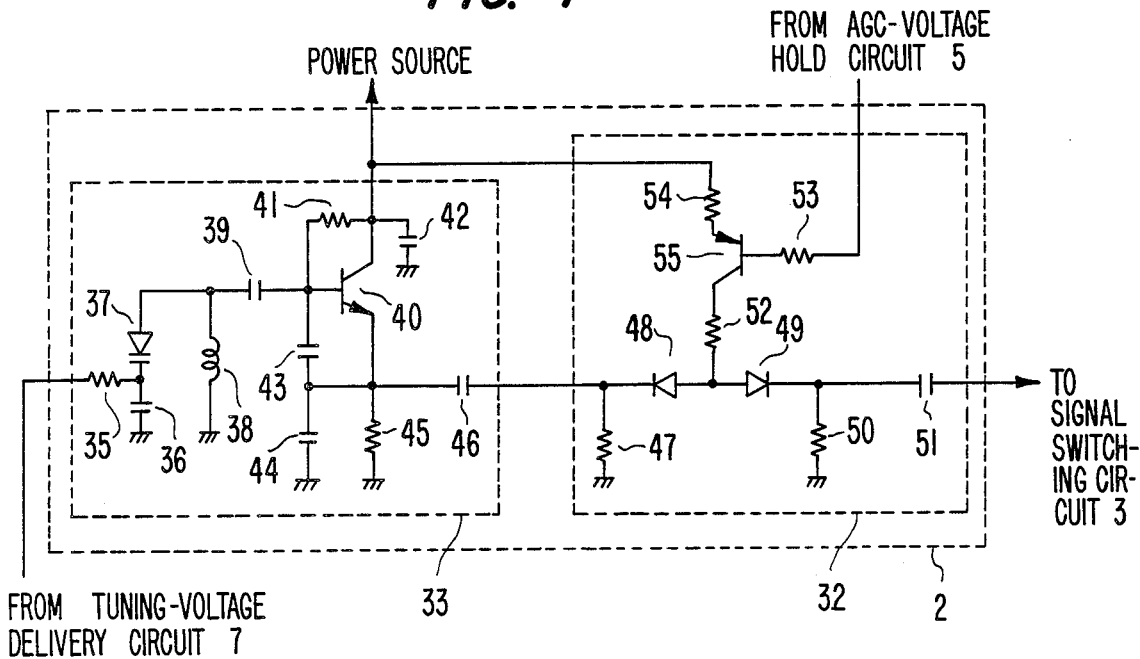

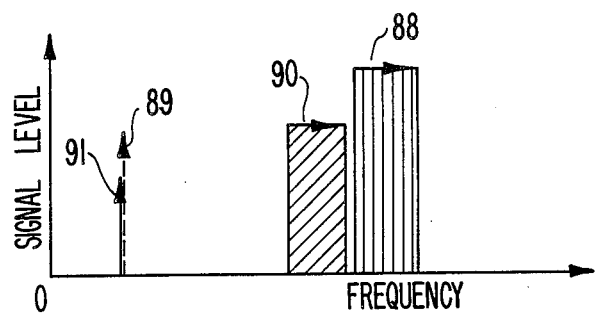
FIG. 16
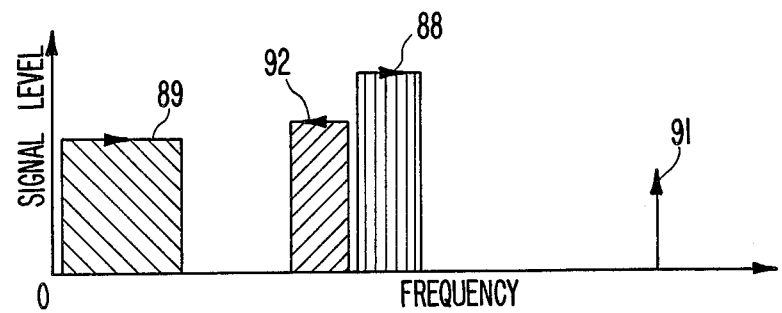
FIG. 17
FIG. 18
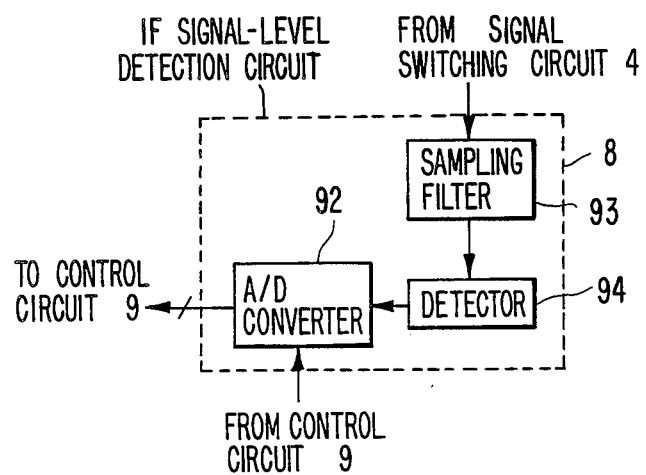

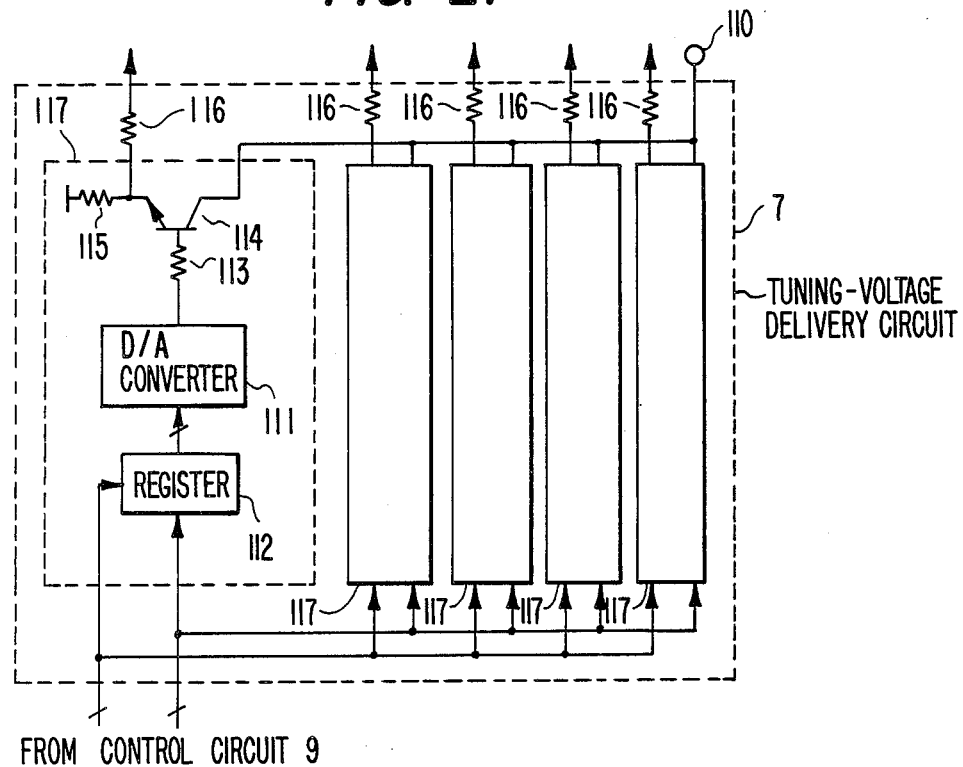
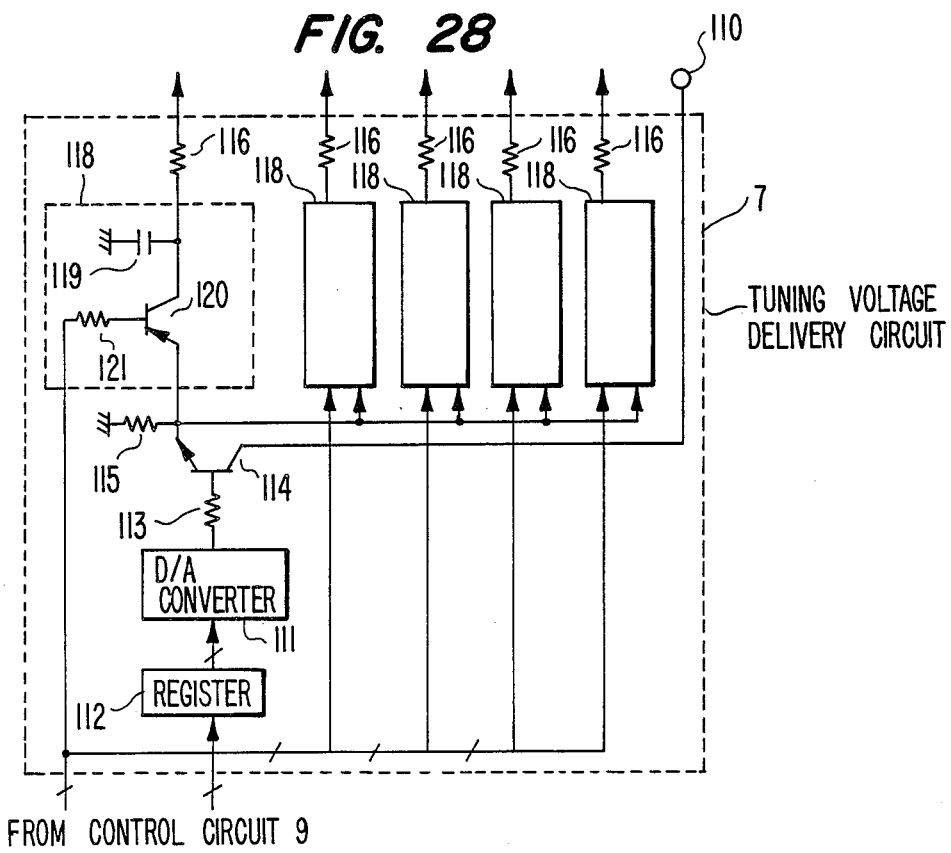

SIGNAL RECEIVER HAVING AUTOMATIC FREQUENCY CHARACTERISTIC ADJUSTING CAPABILITY

BACKGROUND OF THE INVENTION

1. Field of the Invention

The present invention relates to a signal receiver which is significantly effective for use with a tuner.

2. Description of the Prior Art

Any conventional signal receivers, in particular, the signal receiver which is provided with tuning circuits using varactor diodes feeds identical voltages to respective tuning circuits, and thus, due to different capacitances between varactor diodes, there is a considerable difference between frequency characteristics of respective tuning circuits. To compensate for this, one of the prior art systems had proposed a specific constitution related to the independent control over respective tuning circuits for maximizing the output of intermediate frequencies by feeding tuning voltages to individual varactor diodes so that the tuning circuits are provided with the best frequency characteristics. This prior art system is expressly disclosed in Japanese Patent Publication No. 58-18008 and presented in the technical publication "COMPUTER CONTROLLED TELEVISION CHANNEL SELECTION AND TUNER ALIGNMENT", written by Daniel Dumont and Arno Neelen; IEEE ICCE85 SESSION V—TV SIGNAL PROCESSING II, DIGEST OF TECHNICAL PAPERS, June, 1985, respectively.

However, the circuit constitution proposed by this prior art system causes the output of the intermediate frequencies to be controlled only in the maximizing direction and seeks maximum power within the output signal bands. consequently, there is no room for identifying whether or not frequency characteristics of respective tuning circuits exactly match ideal characteristics within the output signal. Although the proposed prior art system improves power gain and signal-to-noise (S/N) ratio, signals may be distorted themselves due to inclined frequency characteristics within the output signal bands.

SUMMARY OF THE INVENTION

A primary object of the present invention is to provide a novel signal receiver which first detects variations of the frequency characteristic of the signal receiver within receivable signal bands caused by gain control and vriations of said frequency characteristics between channels by applying a plurality of frequencies, followed by control of the frequency characteristics so that the best characteristics can be generated, while the signal receiver reflecting the present invention dispenses with severe suppression of the error of tuning elements and features significantly improved performance characteristics and productivity as well.

To securely realize the above object, the present invention provides a signal receiver featuring the following functional constitution: First, the signal receiver related to the present invention generates a reference signal that sweeps frequencies of desired channel bands, and then feeds said reference signal to an input terminal of the receiver unit via a signal-switching circuit that performs switching of the desired-channel signal and the reference signal. The signal receiver then detects the signal strength present in plural frequencies of intermediate frequencies delivered to an output terminal of said reference signal, and after storing the detected signal data in a memory, the signal receiver compares the detected signal data to the desired frequency characteristics. Then, the signal receiver determines tuning voltages of respective tuning circuits so that differences arising from said comparison can be minimized. After determining the tuning voltages, these voltages are delivered to respective tuning circuits, and then a switching operation between the reference signal and the desired channel signal is executed before said signal receiver eventually receives the switched signal.

By realizing the system constitution mentioned above, the signal receiver reflecting the present invention can securely achieve the desired frequency characteristics, and as a result, frequency characteristics of signals within receivable bands can be improved significantly. In addition, said signal receiver can effectively eliminate deterioration of frequency characteristics within receivable bands caused by errors of the tuning elements, variations of the frequency characteristics while controlling gains, and channel-to-channel error. Thus, the present invention provides an extremely useful signal receiver featuring the significantly improved performance characteristics and productivity.

BRIEF DESCRIPTION OF THE DRAWINGS

The present invention will be better understood from the detailed description given herein below and the accompanying drawings which are given by way of illustration only, and thus are not limitative of the present invention wherein:

FIG. 6 is a schematic diagram of the circuit comprised of a circuit for generating sweep signals, primary oscillator, and the signal-level controller type mixer reflecting a still another preferred embodiment;

FIG. 7 is a schematic diagram of the signal-level controller circuit of the sweep-signal generating circuit, which is comprised of two groups of diodes, reflecting a still further preferred embodiment;

FIG. 16 is a chart denoting the relationship of frequencies of respective signals when the primary oscillator oscillates within the intermediate frequency band and frequency generated by the local oscillator executes sweeping operation reflecting still another preferred embodiment derived from the second preferred embodiment;

FIG. 17 is a chart denoting the relationship of frequencies of respective signals when the primary oscillator oscillates within a specific band corresponding to the sum of frequencies generated by the local oscillator and the desired channel and the frequency generated by said local oscillator executes a sweeping operation reflecting still a further embodiment derived from the second preferred embodiment;

FIG. 18 is a schematic block diagram of the circuit of another preferred embodiment, in which the circuit for detecting the signal level of intermediate frequency is comprised of a sampling filter, a detector, and an A/D converter;

FIG. 27 is a schematic block diagram of the circuit of one of the preferred embodiments, in which D/A converters of the tuning voltage supply circuit are connected to each other in parallel and whose number is identical to that of the tuning circuits;

FIG. 28 is a schematic block diagram of the circuit of one of the preferred embodiments, which is comprised of one D/A converter;

DESCRIPTION OF THE PREFERRED EMBODIMENTS

Figure 1:
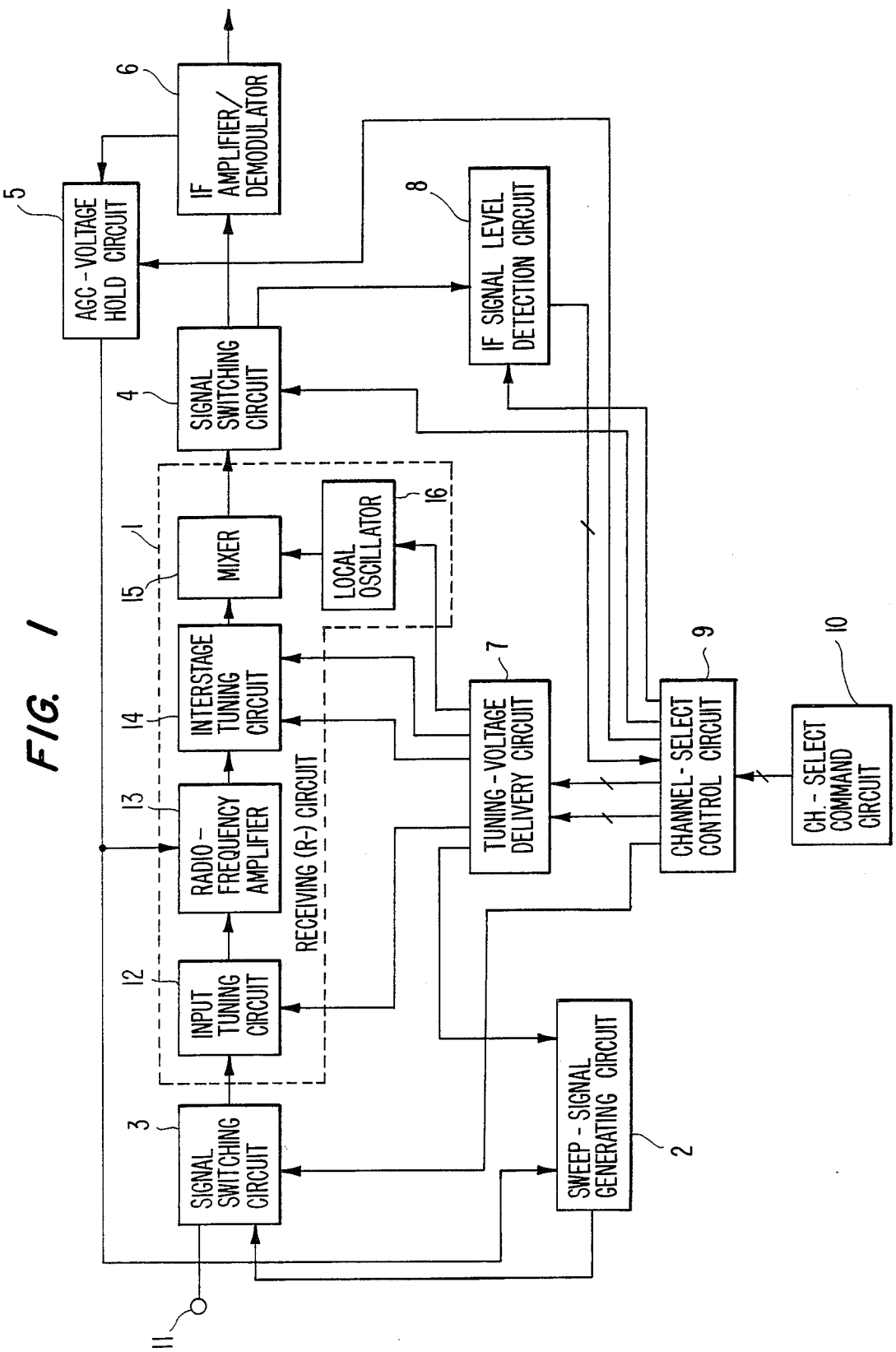
FIG. 1 is a simplified block diagram of the circuit making up the signal receiver using reference signals generated by an oscillator within the desired channel band reflecting the first preferred embodiment of the present invention.

Referring now to the accompanying drawings, the first preferred embodiment of the present invention is described below. In FIG. 1, using frequency conversion, a receiving circuit 1 (R-circuit, hereinafter) converts a signal of the desired channel into a specific intermediate frequency. Said R-circuit 1 is comprised of an input tuning circuit 12, a radio-frequency (RF) amplifier 13, an interstage tuning circuit 14, a mixer 15 and a local oscillator 16. A signal of the desired channel band is delivered to the radio-frequency amplifier 13 via the input tuning circuit 12, wherein said radio-frequency amplifier 13 allows the gain of the signal to vary in proportion to an AGC voltage. The amplified signal is then delivered to the interstage tuning circuit 14 which eliminates any signals of the image-band, and then the mixer 15 mixes said signal with the signal generated by the local oscillator 16, and as a result, the intermediate frequency signal is generated at the output terminal of the mixer 15. Since a double tuning circuit is often made available for said interstage tuning circuit, at least two systems of the tuning voltage are necessary.

By activating a channel-select command circuit 10 and a channel-select control circuit 9, a desired channel is selected by feeding the identical tuning voltages to the input tuning circuit 12, the interstage tuning circuit 14, and the local oscillator 16 before eventually receiving signals from the selected channel. The desired channel signal is received from a terminal 11, and then a signal switching circuit 3 functions so that a control circuit 9 can deliver signals from the R-circuit 1 to the following input tuning circuit 12 of another R-circuit 1 (not shown). The R-circuit 1 then converts the received signal into an intermediate frequency signal, which is then delivered to a signal switching circuit 4. The signal switching circuit 4 functions to allow the control circuit 9 to deliver signals from the R-circuit 1 to the following intermediate frequency (IF) amplifier/demodulator 6. The intermediate frequency signal which passed through the signal switching circuit 4 is then amplified and detected by an intermediate frequency amplifier/demodulator 6 before being delivered to the following signal processing circuit. The intermediate frequency amplifier/demodulator 6 generates an AGC voltage for delivery to an AGC-voltage hold circuit 5, which then delivers this voltage to the radio-frequency amplifier 13 and sweep signal generating circuit 2.

The AGC-voltage hold circuit 5 holds an AGC voltage corresponding to the desired channel signal level for a specific duration, and then the control circuit 9 delivers a control signal to signal switching circuit 3, where the signal from said sweep signal generating circuit 2 is subjected to switching before being sent to the input tuning circuit 12 of R-circuit 1, and finally the reference signal of the desired channel band generated by said sweep signal generating means 2 is delivered to R-circuit 1. Simultaneously, a reference signal having a specific level corresponding to the AGC voltage from AGC the voltage hold circuit 5 is also supplied to R-circuit 1. After being delivered to R-circuit 1, the reference signal is then subjected to frequency-conversion before being delivered to signal switching circuit 4. The signal switching circuit 4 is then switched by control circuit 9 so that the intermediate frequency signal can be fed to the intermediate-frequency signal level detection circuit 8, which then converts the intermediate frequency signal into a DC signal corresponding to the detected signal level. The DC signal is then binary-coded before being delivered to the control circuit 9. Using the binary-coded DC-level signal, the control circuit 9 computes the signal level of a plurality of frequencies present in R-circuit 1 for detecting the frequency characteristics, and then it causes the tuning voltages of the input tuning circuit 12 and interstage tuning circuit 14 to vary slightly in the direction of reducing differences from the desired frequency characteristics, and finally, it outputs the varied tuning voltages through the tuning-voltage delivery circuit 7. If these frequency characteristics in R-circuit 1 were still different from the desired frequency characteristics, the control circuit 9 causes the tuning voltages to vary furthermore until all of the frequency characteristics eventually match each other. When these frequency characteristics exactly match the desired characteristics, the control circuit 9 stores respective tuning voltages in a memory, and then it causes the signal switching circuits 3 and 4 to be switched in the direction of receiving the desired channel signal. On the other hand, the AGC-voltage hold circuit 5 discontinues retention of the AGC voltage and directly delivers it to the radio-frequency amplifier 13 and sweep-signal generating circuit 2 without holding the AGC voltage from intermediate-frequency amplifier/demodulator 6 and maintains this state until starting to select the desired channel again.

According to the first preferred embodiment of the present invention, since the system retains a specific AGC voltage corresponding to the field intensity while receiving the desired-channel signal and compares the level deviations beteen a plurality of frequencies, in comparison to the conventional provision of tuning voltages for merely seeking the maximum point of the intermediate-frequency signal level, the signal receiver reflecting the first preferred embodiment of the present invention not only correctly receives the desired-channel signals using the significantly improved performance characteristics, but it also securely suppresses errors generated by the tuning circuit even when respective tuning elements function with erroneous components.

Figure 2:
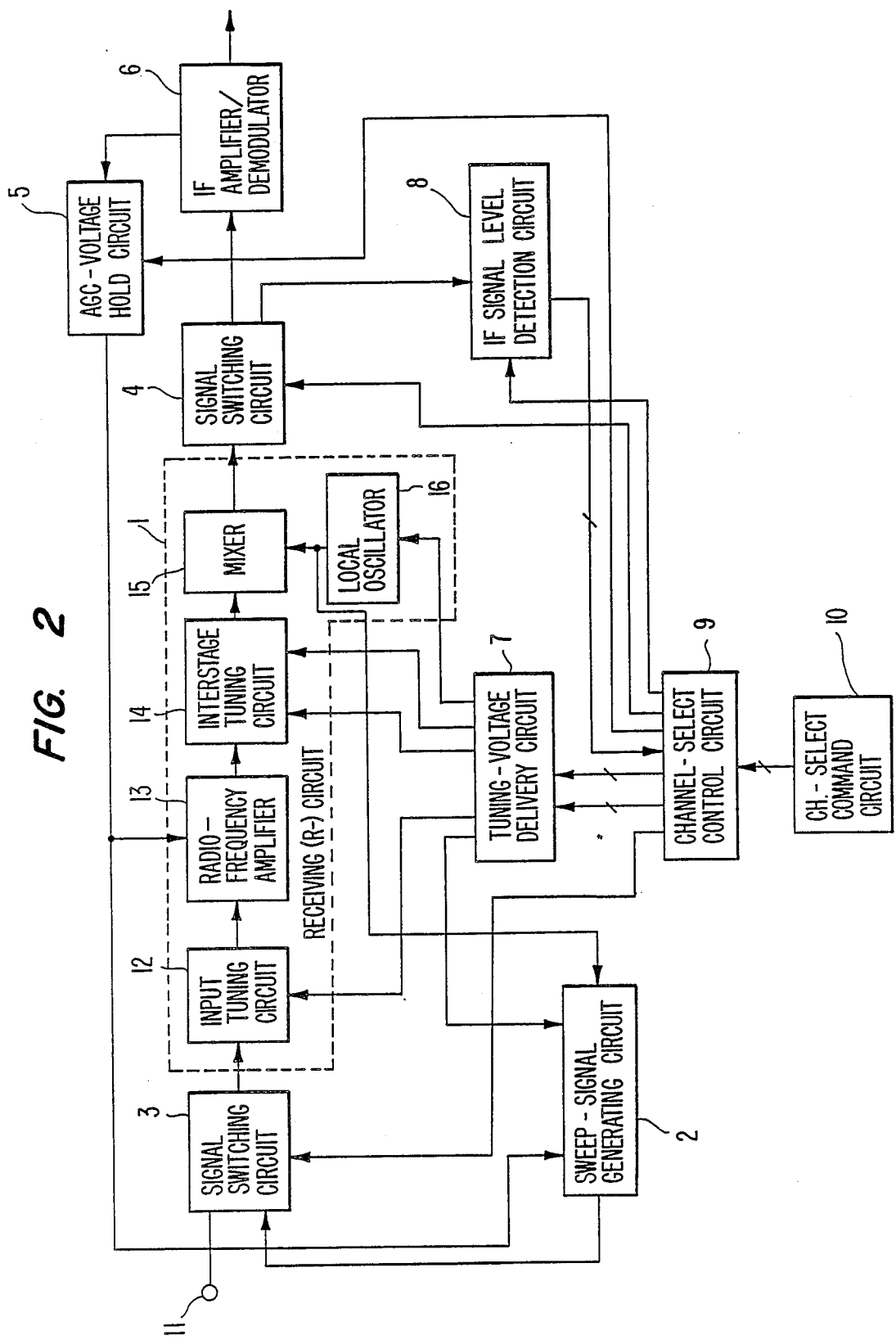
FIG. 2 is a simplified block diagram of the circuit making up the signal receiver which uses reference signals comprised of signals generated within the desired channel bands by applying the integration of signals generated by the primary and local oscillators reflecting the second preferred embodiment of the present invention.

Next, referring to the accompanying drawings, the second preferred embodiment of the present invention is described below. In FIG. 2, R-circuit 1 converts the desired-channel signal into a specific intermediate frequency by applying frequency-conversion. R-circuit 1 is comprised of the input tuning circuit 12, the radio-frequency amplifier 13, the interstage tuning circuit 14, the mixer 15, and the local oscillator 16. The signal of the desired channel band is delivered to the radio-frequency amplifier 13 via the input tuning circuit 12. After amplification, the interstage tuning circuit 14 eliminates signals present in the imageband, while genuine signal components are then mixed together with a generated signal from the local oscillator 16 by means of the mixer 15, which then outputs a specific intermediate frequency signal. Since double tuning circuits are often made available for the interstage tuning circuit, at least two systems of tuning voltages are necessary.

By activating the channel-select command circuit 10 and channel-select control circuit 9, the desired channel is selected by feeding the identical tuning voltages to the input tuning circuit 12, the interstage tuning circuit 14, and the local oscillator 16 before eventually receiving signals from the selected channel. The desired channel signal is received from terminal 11, and then the signal switching circuit functions so that the control circuit 9 can deliver a signal from the R-circuit 1 to the following input tuning circuit 12 of a subsequent R-circuit 1 (not shown). Receiver 1 then converts the received signal into an intermediate frequency signal, which is then delivered to the signal switching circuit 4. The signal switching circuit 4 functions to allow the control circuit 9 to deliver a signal from R-circuit 1 to the following intermediate frequency amplifier/demodulator 6. The intermediate frequency signal which passed through the signal switching circuit 4 is then amplified and detected by the intermediate frequency amplifier/demodulator 6 before being delivered to the following signal processing circuit. The intermediate frequency amplifier/demodulator 6 generates an AGC voltage for delivery to the radio-frequency amplifier 13 and sweep signal generator 2.

The AGC-voltage hold circuit 5 holds an AGC voltage corresponding to the desired channel signal level for a specific duration, and then the control circuit 9 delivers a control signal to signal switching circuit 3, where the signal from said sweep signal generating circuit 2 is subjected to switching before being sent to the input tuning circuit 12 of R-circuit 1, and finally a reference signal of the desired channel band generated by said sweep signal generating circuit 2 is delivered to R-circuit 1, where a reference signal of the desired channel band is generated by applying part of a generated signal from the local oscillator and a differential frequency from the primary oscillator of the sweep signal generating circuit 2 of R-circuit 1. Simultaneously, a reference signal having a specific level corresponding to the AGC voltage from the AGC-voltage hold circuit 5 is also supplied to R-circuit 1. After being delivered to R-circuit 1, the reference signal is then subjected to frequency-conversion before being delivered to the signal switching circuit 4. The signal switching circuit 4 is then switched by the control means 9 so that the intermediate frequency signal can be fed to the intermediate-frequency signal level detection circuit 8, which then converts the intermediate frequency signal into a DC signal corresponding to the detected signal level. The DC signal is then binary-coded before being delivered to the control circuit 9. Using the binary-coded DC-level signal, the control circuit 9 computes the signal level of a plurality of frequencies present in R-circuit 1 for detecting the frequency characteristics, and then it causes the tuning voltages of the input tuning circuit 12 and interstage tuning circuit 14 to vary slightly in the direction of reducing the difference from the desired frequency characteristics, and finally, it outputs the varied tuning voltages through the tuning-voltage delivery circuit 7. If these frequency characteristics in R-circuit 1 were still different from the desired frequency characteristics, the control circuit 9 causes the tuning voltages to vary furthermore until all of the frequency characteristics eventually match each other. When these frequency characteristics exactly match the desired frequency characteristics, the control circuit 9 stores respective voltage values in a memory, and then it causes the signal switching circuits 3 and 4 to be switched in the direction of receiving the desired channel signal. On the other hand, the AGC-voltage hold circuit 5 discontinues retention of the AGC voltage and directly delivers it to radio-frequency amplifier 13 and sweep-signal generating circuit 2 without holding the AGC voltage from the intermediate-frequency amplifier/demodulator 6 and maintains this state until starting to select the desired channel again.

According to the second preferred embodiment of the present invention, since the system retains a specific AGC voltage corresponding to the field intensity while receiving the desired-channel signal and compares the level deviation between a plurality of frequencies, in comparison to the conventional provision of tuning voltages for merely seeking the maximum point of the intermediate frequency signal level, the signal receiver reflecting the second preferred embodiment of the present invention not only correctly receives the desired channel signal using the significantly improved performance characteristics, but it also securely suppresses error generated by the tuning circuit even when respective tuning elements function with erroneous components.

Figure 3:
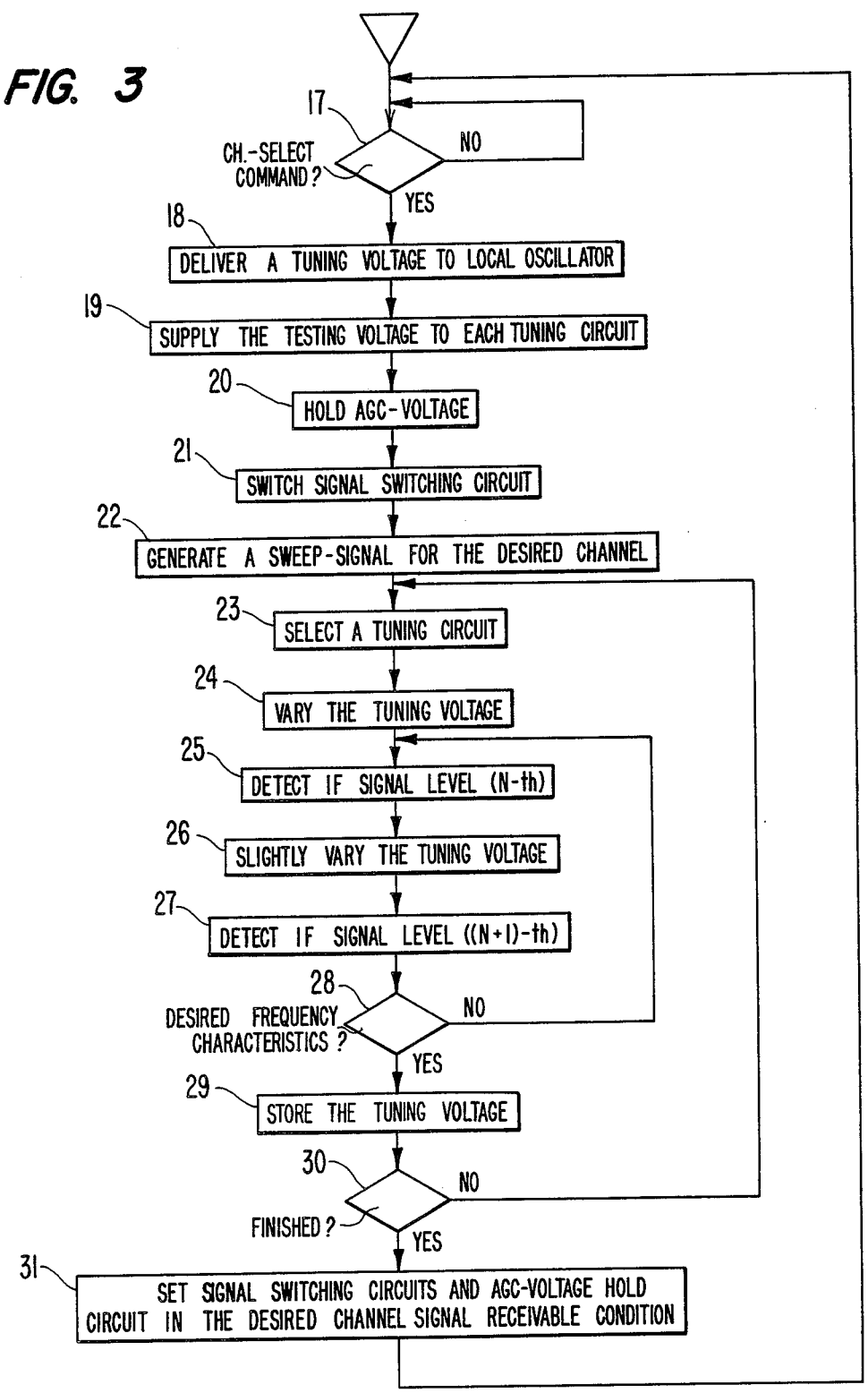
FIG. 3 is a flowchart related to the sequential operations of the signal receiver in conjuction with the first preferred embodiment of the present invention.

FIG. 3 represents the chart describing the sequential procedure needed for controlling the tuning operation related to the first preferred embodiment using the control circuit 9. While R-circuit 1 operates for receiving the desired channel signal, the system remains in an identifying routine 17, where the system stands by for receiving a channel (Ch)-select command from channel-select command circuit 10. When changing the desired-channel signal, i.e., when changing it to another channel, the channel-select command circuit outputs the binary-coded channel control signal. After detecting this signal in the identifying routine 17, as shown in routine 18, the control circuit 9 delivers a specific tuning voltage corresponding to the desired channel to the local oscillator 16 of R-circuit 1. When routine 19 is entered, the control circuit provides the input tuning circuit 12 and the interstage tuning circuit 14 with tuning voltages having specific potentials identical to the tuning voltage fed to said local oscillator 16. This allows R-circuit 1 to receive the desired channel, and thus, mixer 15 outputs intermediate frequency signals. This signal then passes through signal switching circuit 4 before being demodulated by intermediate-frequency amplifier/demodulator 6. Said amplifier/demodulator 6 then delivers a specific AGC voltage corresponding to the desired channel signal level to the AGC-voltage hold circuit 5. When routine 20 is entered, AGC voltage is retained so that gain of radio-frequency amplifier 13 and the output level of the sweep-signal generating circuit 2 can be held constant. This activated routine 21, in which the signal-switching circuit 3 is switched to the sweep-signal generating circuit 2, and likewise, the signal switching circuit 4 is switched to the intermediate-frequency signal level detection circuit 8. When routine 22 is entered, the tuning-voltage delivery circuit 7 delivers a specific tuning voltage to allow the sweep-signal generating circuit 2 to sweep frequencies within the desired channel frequency band.

This activates routine 23, in which either the input tuning circuit 12 or the interstage tuning circuit 14 is selected. For example, the system selects the input tuning circuit 12 before proceeding to routine 24. When routine 24 is entered, only the tuning voltage delivered to the input tuning circuit 12 is varied to a level close to the lowest frequency within the desired channel frequencies. When routine 25 is entered, the intermediate-frequency signal level detection circuit 8 detects the signal levels of plural frequencies in the desired channel frequency band from the intermediate frequency signals corresponding to these frequencies. When routine 26 is entered, only the tuning voltage delivered to input tuning circuit 2 is varied slightly before detecting signal levels by applying a procedure identical to that executed during routine 25.

By designating data of signal levels detected during routine 25 to be the N-th data and the signal levels detected during routine 26 to be the N+1th data, routine 28 identifies whether or not the desired frequency characteristics are achieved. If the desired frequency characteristics were achieved, routine 29 is entered.

Conversely, if these characteristics were not yet realized, system operation is returned again back to routine 25 to be followed by routines 26 and 27 before again proceeding to routine 28. When routine 29 is entered, the control circuit 9 stores the binary-coded tuning voltage data fed to the input tuning circuit 12 in a memory to complete the provision of the tuning voltage for the input tuning circuit 12. However, since the interstage tuning circuit 14 still needs to be provided with a tuning voltage, the operation mode returns to routine 23 from routine 30, by applying the selected tuning circuit to be one of the tuning circuits of the interstage tuning circuit 14, the operation mode again sequentially proceeds to routines 24 through 29. In the same way, after the control circuit 9 fully stores data related to tuning voltages in a memory, the operation mode proceeds from identifying routine 30 to routine 31, in which the signal switching circuits 3 and 4 and the AGC-voltage hold circuit 5 are respectively provided with the desired-channel signal receivable condition so that they can respectively receive desired-channel signals. This causes the operation mode to be returned back to routine 17, and as a result, the control circuit 9 causes the system to be in its stand-by mode until the next channel-selection command is generated.

Figures 4, 5:
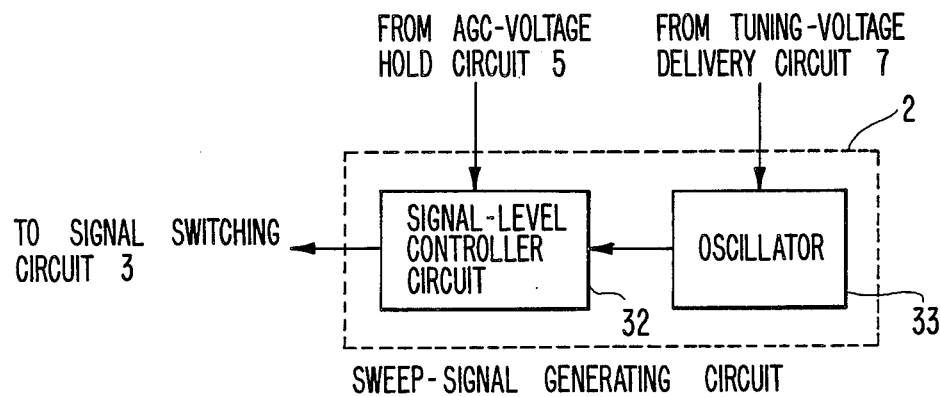
FIG. 4 is a chart denoting the basis of identifying frequency characteristics of the signal receiver related to the first preferred embodiment of the present invention.
FIG. 5 is a schematic circuit diagram related to a circuit for generating sweep signals comprised of the primary oscillator and signal-level controller circuit reflecting another preferred embodiment.

FIG. 4 represents the chart related to one of the preferred embodiments for designating the identification basis when executing the identifying routine 28 of the tuning control circuit as shown in FIG. 3. The N-th and N+1th data detected by routines 25 and 26 are delivered to the control circuit 9, which then checks to see the maximum values compared between respective center frequencies present in the desired-channel frequency bands and the flatness of more than two units of frequencies. In particular, since the flatness of the frequency characteristics present in R-circuit 1 precedes the maximum value, independent of the magnitude of the maximum values of the N-th and N+1th data, if the N-th data proves to be flat, the system introduces the N-th data. Conversely, if the N-th data proves to degrade the flatness of the frequency characteristics, the identification (ID) step 2 is entered, in which only when the N+1th data proves to ensure flatness of frequency characteristics, does the system introduce either the N-th data or the N-1th data, whichever designates the maximum value. However, while said identification step 2 is still underway, if the N+1th data proves that no flatness is achieved for the frequency characteristics, both the N-th and N+1th data are identified to be defective for use, and then, the system proceeds to further routines so that the tuning voltage is further subjected to fine variations.

FIGS. 5 through 11 respectively denote typical embodiments of the present invention in conjunction with sweep-signal generating circuits of the signal receiver.

The sweep signal generating circuit shown in FIG. 5 is comprised of a primary oscillator 33 and a signal-level controller circuit 32. The tuning voltage delivery circuit 7 delivers a specific tuning voltage to the sweep-signal generating circuit so that oscillator 33 can securely oscillate within the desired-channel frequency band to correctly sweep frequencies. The signal generated by oscillator 33 is delivered to said signal-level controller circuit 32. The AGC-voltage hold circuit 5 feeds an AGC voltage to said signal-level controller circuit 32 so that the delivered signals can be set to the predetermined level corresponding to the AGC voltage before eventually being delivered to signal switching circuit 3 as the reference signal. Using the system shown in FIG. 5, the reference signal can easily be generated.

FIG. 6 represents another preferred embodiment of the sweep-signal generating circuit of the signal receiver related to the present invention, which is comprised of the primary oscillator 33 and a signal-level control-type mixer 34. The tuning voltage delivery circuit 7 delivers a specific tuning voltage so that said oscillator 33 can oscillate within a specific frequency band corresponding to either the intermediate frequency band or the sum of the frequency generated by the local oscillator 16 and the desired channel frequency, while the signal generated by the primary oscillator 33 and part of the signal generated by local oscillator 16 are respectively delivered to the signal-level control type mixer 34. The AGC-voltage hold circuit 5 feeds a specific AGC voltage to said signal-level control type mixer 34, which is then set to a specific signal level corresponding to the level of the AGC voltage before being delivered to signal-switching circuit 3 as the reference signal. By introducing the system shown in FIG. 6, the intermediate frequency signal can be made available either for the stationary frequency or sweeping frequency, and yet, it is possible for the system to freely make up the constitution of intermediate-frequency signal level detection circuit.

The primary oscillator 33 shown in FIG. 7 is provided with a varactor diode 37 that makes up a tank circuit in the base electrode of transistor 40 via capacitor 39 and the parallel resonance circuit made of coil 38, which are respectively connected to each other. The cathode of the varactor diode 37 is grounded by capacitor 36, while the tuning voltage delivery circuit 7 feeds a specific tuning voltage in the desired-channel frequency band to the cathode-capacitor connection point via resistor 35. Capacitors 43 and 44 are substantially feedback capacitors, and the oscillating frequency is determined by the varactor diode 37, capacitors 43, 44 and 39, and the coil 38. Resistors 41 and 45 respectively bias said transistor 40, while the collector electrode of this transistor is grounded via capacitor 42. The generated signals are fed to the cathode of the diode 48 of signal-level controller circuit 32 via a DC-blocking capacitor 46. The anodes of diodes 48 and 49 are connected to each other, while the signals from the cathode of diode 49 are delivered to the signal-switching circuit 3 via capacitor 51. The collector electrode of transistor 55 is connected to the connection point of the anodes of diodes 48 and 49 via resistor 52, whereas the base electrode of said transistor 55 is provided with an AGC voltage which is delivered from the AGC-voltage hold circuit 5 via resistor 54. The emitter electrode of said transistor 55 is connected to a power-supply source via resistor 54. The cathodes of diodes 48 and 49 are respectively grounded via resistors 47 and 50. In response to the AGC voltage from the AGC-voltage hold circuit 5, the current flowing through the collector of transistor 55 varies so as to cause the insertion loss of said diodes 48 and 49 to also vary, and as a result, the level of the signal delivered to said signal-switching circuit 3 also varies. The system shown in FIG. 7 features a simple circuit constitution and effectively functions when oscillator 33 generates high-level signals.

Figure 8:
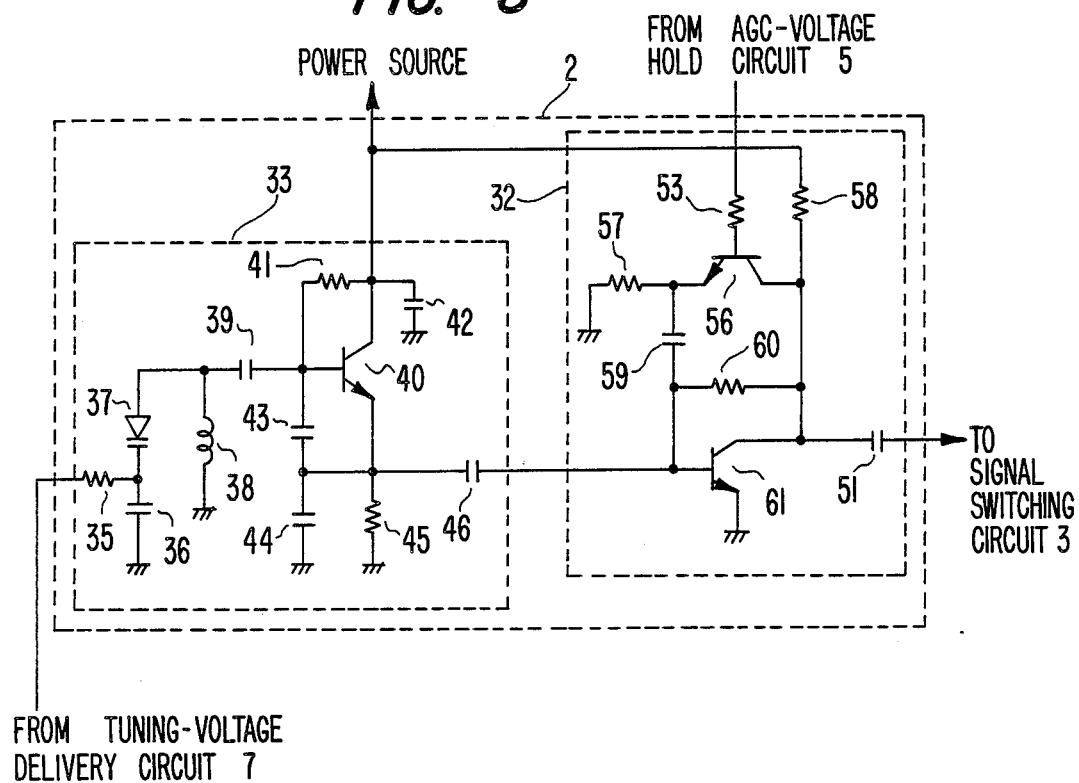
FIG. 8 is a schematic diagram of the signal-level controller circuit of the sweep-signal generating circuit, which is comprised of two groups of transistors, reflecting a still further preferred embodiment.

The primary oscillator shown in FIG. 8 has the constitution and functions exactly identical to those which are explained in the above description related to FIG. 7, and therefore, a detailed description thereof has been omitted. The generated signal is first delivered to the signal-level controller circuit 32 via capacitor 46, which is then fed to the base electrode of transistor 61. The emitter electrode of transistor 61 is grounded, whereas a biasing resistor 60 is connected between the base-and-collector electrodes and a resistor 58 is connected between the collector electrode and a power-supply source, respectively. The collector electrode of the transistor 61 is connected to the collector electrode of transistor 56. The emitter electrode of the transistor 56 is grounded via resistor 57. The AGC-voltage hold circuit 5 feeds an AGC voltage to the base electrode of the transistor 56 via resistor 53. When the AGC voltage rises, the collector potential of transistor 56 lowers, and at the same time, the bias voltage of transistor 61 also lowers so as to lower the gain, and eventually causes the level of the generated signal to lower before delivery to the signal-switching circuit 3. When the AGC voltage is high, the gain of radio-frequency amplifier 13 also rises so as to lower the level of the generated signal. Conversely, when the AGC voltage is low, the gain of radio-frequency amplifier 13 is also low, and thus a high-level signal is output. This level is proportional to the signal level of the desired channel. The system described above uses a transistor which is provided with amplifying function, thus making it possible for the system to lower the level of the signal generated by said oscillator 33, which in turn usefully serves to prevent unnecessary radiation and spurious jamming as well.

Figure 9:
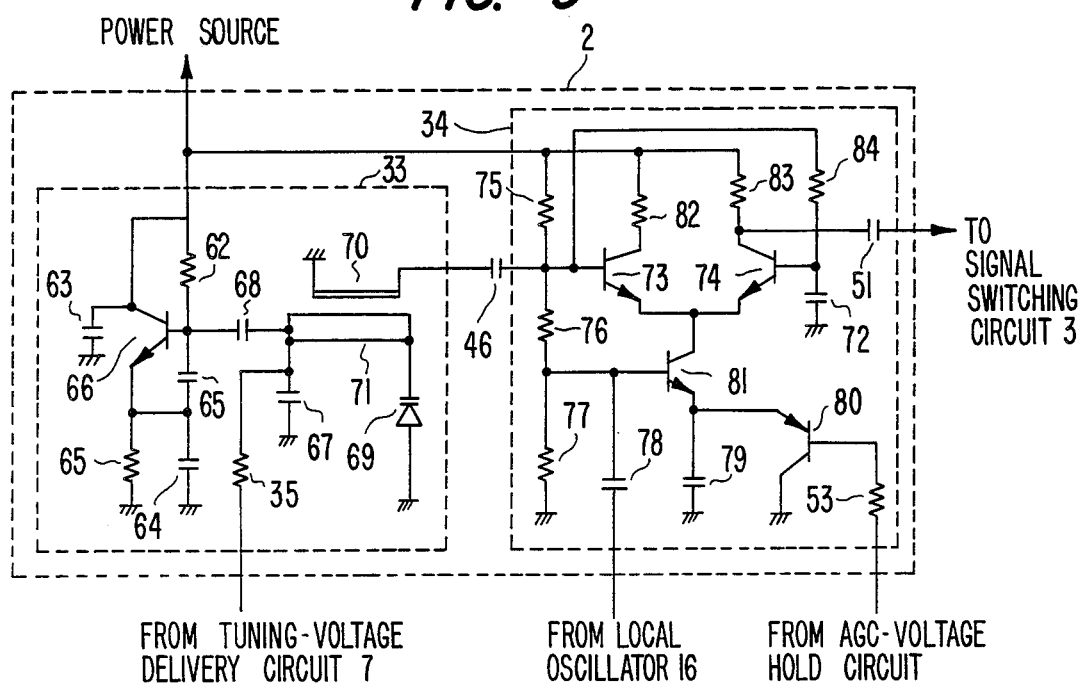
FIG. 9 is a schematic diagram of the signal-level controller type of the sweep-signal generating circuit, which is comprised of four groups of transistors, reflecting a still further preferred embodiment.

The primary oscillator 33 shown in FIG. 9 oscillates at a specific frequency band higher than those of the oscillators shown in FIGS. 7 and 8. The base electrode of transistor 66 is connected via capacitor 68 to a resonance circuit comprised of capacitor 67, tuning line 71, and varactor diode 69. The tuning-voltage delivery circuit 7 delivers a specific tuning voltage to the contact point of capacitor 67 and 68 and tuning line 71 via resistor 35, in which said tuning voltage is either in the intermediate frequency band or in a specific frequency band corresponding to the sum of the frequency generated by the local oscillator 16 and the desired-channel frequency. Capacitors 64 and 65 are substantially feedback capacitors. Resistors 62 and 65 respectively bias transistor 66, while the collector electrode of this transistor is grounded via capacitor 63. The generated signal is fed to line 70 from tuning line 71 by means of magnetic-field coupling and then delivered to the base electrode of transistor 73 of a signal-level control-type mixer 34 via a DC blocking capacitor 46. The emitter electrodes of transistors 73 and 74 are connected to each other, whose contact point is connected to the collector electrode of transistor 81. On the other hand, the emitter electrode of transistor 81 is connected to the emitter electrode of transistor 80, while the collector electrode of transistor 80 is grounded. The AGC-voltage hold circuit 5 delivers a AGC voltage to the base electrode of transistor 80 via resistor 53 to allow an emitter current corresponding to the AGC voltage to flow into transistor 81 via transistor 80. The local oscillator 16 delivers part of the signal generated therein to the base electrode of transistor 81 via a DC-blocking capacitor 78. The base electrode of transistor 74 is grounded via capacitor 72. The signal delivered to the base electrode of said transistor 73 and part of the signal generated by the local oscillator 16 fed to the base electrode of said transistor 81 are respectively mixed together in transistors 73 and 74, which then generate signals corresponding to the desired-channel frequency band. These signals are then delivered from the collector electrode of said transistor 74 to the signal-switching circuit 3 via a DC-blocking capacitor 51. Since the current flowing through the emitters of transistors 80 and 81 is varied by the AGC voltage, the current flowing through the emitters of said transistors 73 and 74 also varies, thus eventually varying the conversion gain of said mixer 34. As a result, when the AGC voltage is high, the emitter current lowers, thus causing the conversion gain of the mixer 34 to lower, and consequently, the level of reference signal lowers itself before delivery to the signal-switching circuit 3. Conversely, when the AGC voltage is low, the level of reference signal rises, thus making it possible for the system to generate a signal which is proportional to the level of the desired channel signal. Resistors 75 through 77 and 82 through 84 are respectively biasing resistors, while capacitor 79 is used for grounding high frequencies. Since the system shown above uses equilibrium-type signal-level controlling mixer 34, it effectively suppresses spurious jamming.

Figure 10:
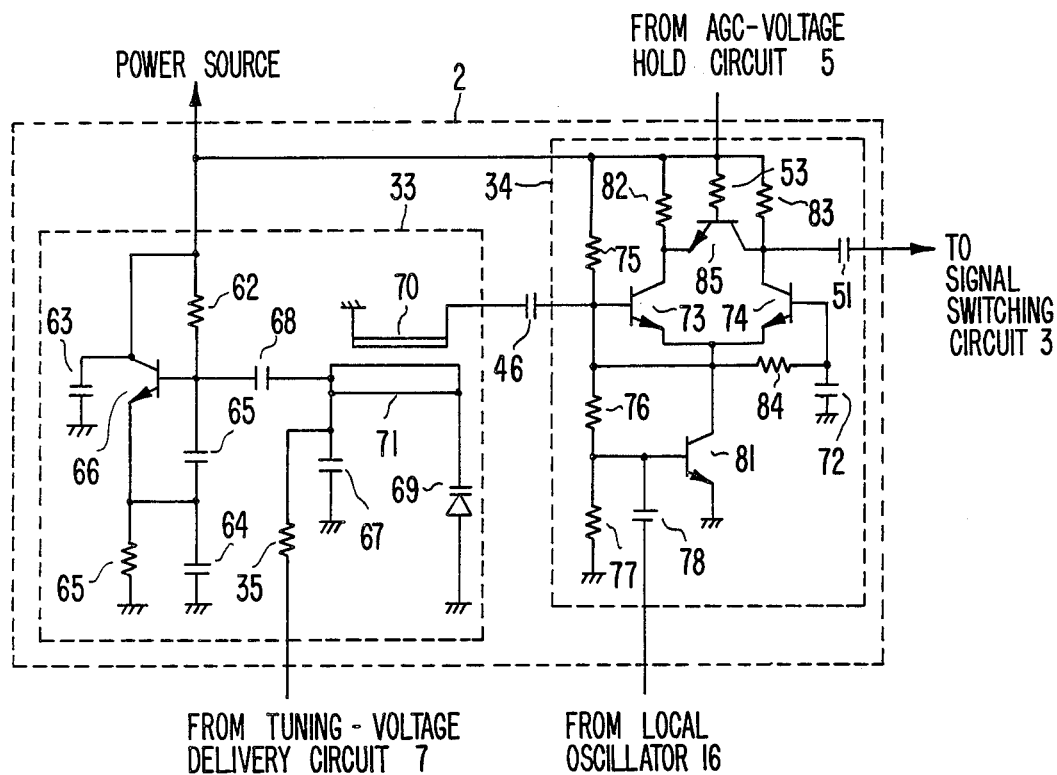
FIG. 10 is a schematic diagram of the signal-level controller type mixer of the sweep-signal generating circuit, which is comprised of four groups of transistors, reflecting a still further preferred embodiment.

Since the primary oscillator 33 shown in FIG. 10 performs operations exactly identical to those which have been described with reference to FIG. 9, a detailed explanation thereof has been omitted. The signal generated by the primary oscillator 33 is delivered to the base electrode of the transistor 74 of the signal-level control-type mixer 34 from line 70 via a DC-blocking capacitor 46. The emitter electrodes of transistors 73 and 74 are connected to each other, while the collector electrode of transistor 81 is connected to the contact point of these emitter electrodes. The emitter electrode of transistor 81 is grounded, while said emitter electrode is connected to emitter/collector electrodes of transistor 85 between collector electrodes of transistors 73 and 74. The AGC-voltage hold circuit 5 feeds an AGC voltage to the base electrode of transistor 85 via resistor 53 so that the potentials of the emitter and collector of said transistor 85 and the collectors of said transistors 73 and 74 can vary in response to the delivered AGC voltage. On the other hand, local oscillator 16 feeds part of the signal generated therein to the base electrode of said transistor 81 via capacitor 78. the base electrode of said transistor 74 grounds the radio-frequency components via capacitor 72. The signal generated by the primary oscillator 33 and delivered to the base electrode of said transistor 73 and part of the signal generated by the local oscillator 16 and fed to the base electrode of said transistors 81 are mixed together by said transistor 73 and 74 before generating a specific signal corresponding to the desired-channel frequency band. This signal is then delivered to the signal-switching circuit 3 from the collector electrode of said transistor 74 via the DC-blocking capacitor 51. Since the potentials of the emitter and collector of transistor 85 are varied by the AGC voltage, the collector potentials of said transistors 73 and 74 also vary themselves, and eventually vary the conversion gain of mixer 34. As a result, when the AGC voltage is high, the collector potential of transistor 74 lowers as the voltage between the base and emitter of said transistor 85 more significantly biases itself in the forward direction, thus causing the conversion gain of said mixer 34 to lower. Consequently, the level of the reference signal lowers before being delivered to the signal-switching circuit 3. Conversely, when the AGC voltage is low, the reference signal level rises, thus making it possible for the system to generate a signal which is proportional to the desired-channel signal level. Resistors 75 through 77 and 82 through 84 are respectively biasing resistors. Since the system shown above uses a signal-level controlling balanced mixer 34, it effectively suppresses spurious jamming.

Figure 11:
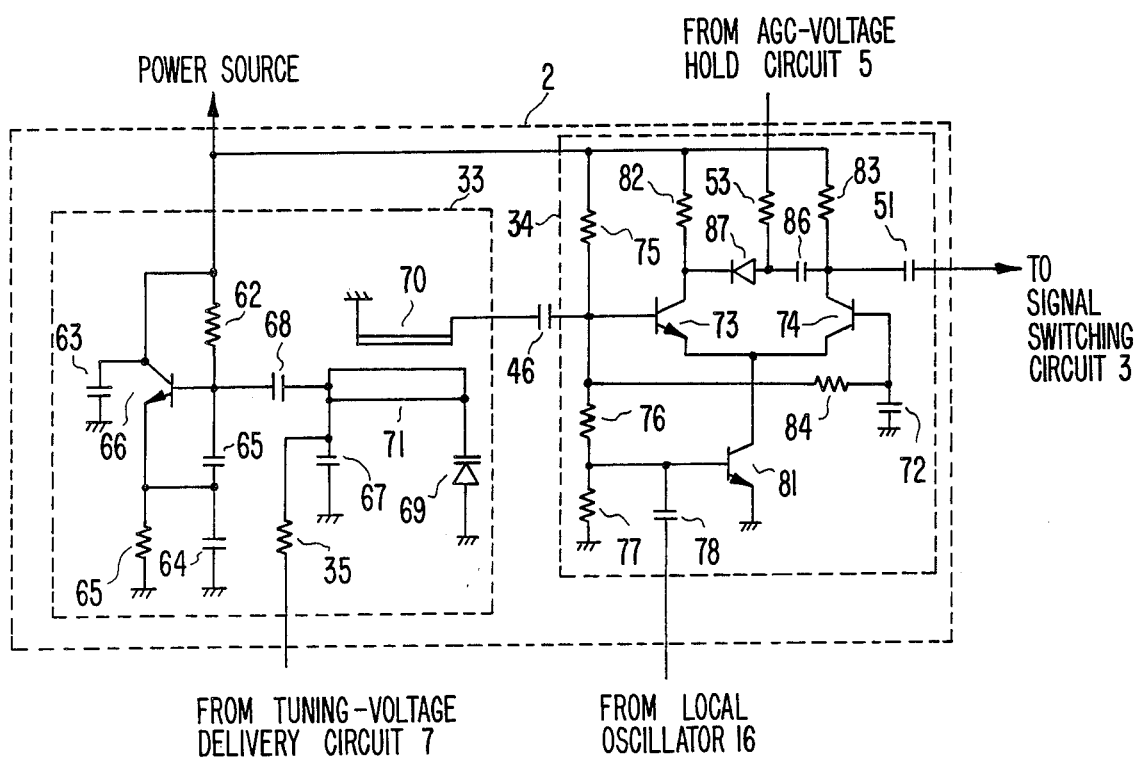
FIG. 11 is a schematic diagram of the signal-level controller type mixer of the sweeping circuit, which is comprised of three groups of transistors and a piece of diode, reflecting a still further preferred embodiment.

Since the primary oscillator 33 of FIG. 11 performs operations exactly identical to those which have been described with reference to FIG. 9, a detailed explanation thereof has been omitted. The signal generated by the primary oscillator 33 is delivered to the base electrode of the transistor 73 of the signal-level control-type mixer 34 from line 70 via a DC-blocking capacitor 46. The emitter electrodes of the transistors 73 and 74 are connected to each other, while the collector electrode of transistor 81 is connected to the contact point of these emitter electrodes. The emitter electrode of said transistor 81 is grounded, while the collector electrode of transistor 73 is connected to the cathode of diode 87. The capacitor 86 is connected between the anode of said diode 87 and the collector electrode of said transistor 84. The AGC voltage hold circuit 5 delivers a AGC voltage to the anode of said diode 87 via resistor 53 to cause the anode potential of said diode 87 to vary in response to the AGC voltage received. On the other hand, the local oscillator 16 delivers part of the signal generated there to the base electrode of said transistor 81 via a DC-blocking capacitor 78. The base electrode of said transistor 74 grounds the high-frequency components. The signal generated by the primary oscillator 33 and fed to the base electrode of said transistor 73 and part of the signal generated by the local oscillator 16 and fed to the base electrode of said transistor 81 are mixed together by said transistors 73 and 74. As a result, a signal corresponding to the desired-channel frequency band is generated, which is then delivered to the signal-switching circuit 3 from the collector electrode of said transistor 74 via a DC-blocking capacitor 51. When using the system shown in FIG. 11, as the AGC voltage rises, said diode 87 more significantly biases in the forward direction to lower the loss of signal flowing through said diode 87. This allows signals of the desired-channel frequency band present in the collector electrode of transistor 74 and generated by the mixing operation to cancel each other, thus eventually lowering the level of the reference signal before being delivered to the signal-switching circuit 3. Conversely, when the AGC voltage is low, the level of reference signal rises, thus allowing the system to generate a signal which is proportional to the desired-channel signal level. Resistors 75 through 77 and 82 through 84 are respectively biasing resistors. Since the system shown in FIG. 11 uses a signal-level controlling balanced mixer 34, it effectively suppresses spurious jamming.

Figure 12:
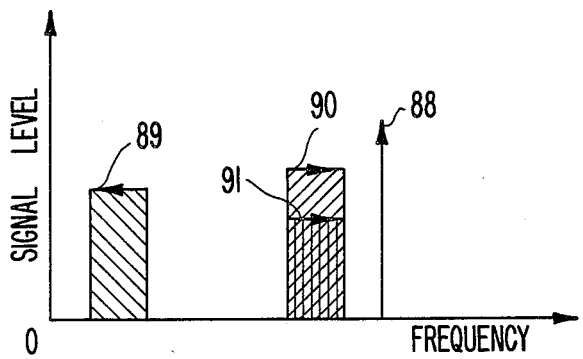
FIG. 12 is a chart denoting the relationship of frequencies of a variety of signals when the primary oscillator oscillates within the desired channel bands in conjunction with the first preferred embodiment.
Figure 13:
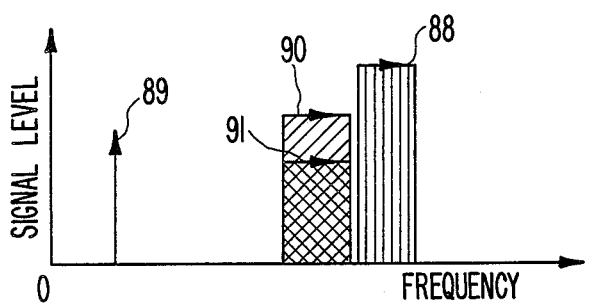
FIG. 13 is a chart denoting the relationship of frequencies of respective signals when the primary oscillator oscillates the desired channel bands related to another preferred embodiment derived from the first preferred embodiment.

FIGS. 12 and 13 are charts respectively denoting the relationship of frequencies used for the sweep-signal generating means 2 of the first preferred embodiment 7 the present invention.

Referring now to FIG. 12, signal 89 denotes the intermediate frequency signal output from R-circuit 1. Signal 90 denotes the reference signal output from said sweep-signal generating means 2. Signal 91 denotes the signal generated by the primary oscillator 33, whereas signal 88 denotes the signal generated by the local oscillator 16.

Primary oscillator 33 generates signals by sweeping frequencies within the desired-channel frequency band. The generated signal level is first controlled by applying an AGC voltage before being made available as a reference signal. Since the local oscillator 16 of R-circuit 1 oscillates at a stationary frequency, a signal containing a swept frequency appears in the intermediate-frequency band. The width and velocity of the frequency-swept signal are identical to those of the signal generated by the primary oscillator 33; however, the frequency is swept in the inverse direction. The frequency relationship shown in FIG. 12 suggests that no spurious disturbance can take place because oscillation is directly applied to signals in the desired-channel frequency band.

FIG. 13 refers to signals 88 through 91 which are shown in FIG. 12 and a detailed description thereof has been omitted.

The primary oscillator 33 generates a signal by sweeping frequencies within the desired-channel frequency band. The level of the generated signal is first controlled by an applying AGC voltage before the signal are made available as a reference signal. Since the local oscillator 16 of R-circuit 1 oscillates by sweeping frequencies, a signal containing a stationary frequency appears in the intermediate frequency band. The signal generated by the local oscillator 16 has the same width, velocity, and direction of swept frequency as those of signals generated by the primary oscillator 33. The frequency relationship shown in FIG. 13 suggests that no spurious disturbance can take place because oscillation is directly applied to signals in the desired-channel frequency band.

Furthermore, since the intermediate-frequency signal contains a stationary frequency, the intermediate-frequency signal-level detection means 8 can easily be made up, thus providing another advantage for the system.

FIGS. 14 through 17 are respectively the charts denoting the frequency relationship related to the sweep-signal generating means 2 making up the second preferred embodiment of the signal receiver reflecting the present invention.

Figure 14:
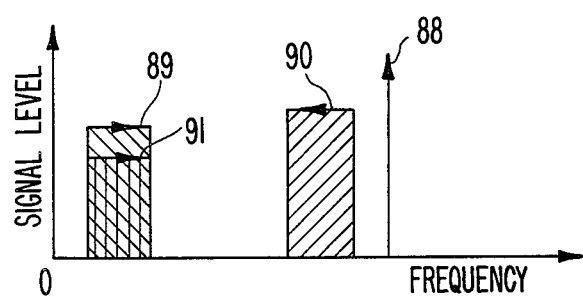
FIG. 14 is a chart denoting the relationship of frequencies of respective signals when the primary oscillator oscillates within intermediate frequency bands and the frequency generated by the local oscillator is stationary, reflecting the second preferred embodiment.

In FIG. 14, signal 88 denotes the signal generated by local oscillator 16. Signal 89 denotes the intermediate-frequency signal output from R-circuit 1. Signal 90 denotes the reference signal output from sweep-signal generating means 2, whereas signal 91 denotes the signal generated by primary oscillator 33.

The primary oscillator 33 generates a signal by sweeping frequencies within the intermediate frequency band. Local oscillator 16 of R-circuit 1 generates a signal by applying a stationary frequency. The signals generated by both oscillators are then mixed together by the sweep-signal generating means 2. The system uses reference signal which is substantially comprised of the differential signal of applied frequencies. As a result, R-circuit 1 outputs a specific intermediate-frequency signal containing swept frequencies. Said intermediate-frequency signal has the same width, velocity, and direction of the swept frequency as those of the signals generated by primary oscillator 33.

The system mentioned above allows optional frequencies within the desired-channel band of intermediate frequency band to be replaced by frequencies to be generated by the primary oscillator 33, thus effectively eliminating the need for identifying respective frequencies additionally made available for the intermediate frequency.

Figure 15:
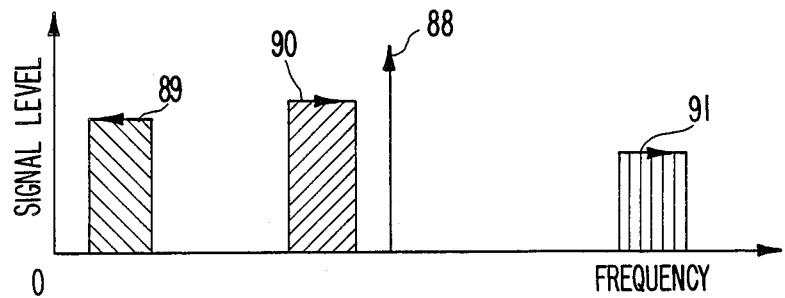
FIG. 15 is a chart denoting the relationship of frequencies of respective signals when the primary oscillator oscillates within a specific band corresponding to the sum of frequency generated by the local oscillator and the desired channel reflecting another preferred embodiment derived from the second preferred embodiment.

FIG. 15 refers to signals 89 through 91 which are shown in FIG. 14 and a detailed explanation thereof has been omitted. The primary oscillator 33 generates a signal by sweeping frequencies of a specific frequency band corresponding to the sum of the desired-channel frequency and the frequency generated by the local oscillator 16. Local oscillator 16 of R-circuit 1 generates a signal by applying a stationary frequency. Both of the generated signals are mixed together by the sweep-signal generating means 2. The system uses a reference signal which is substantially comprised of the differential signal of the applied frequencies. As a result, R-circuit 1 outputs a specific intermediate-frequency signal containing swept frequencies. Said intermediate-frequency signal has the same width, velocity, and direction of the swept frequency as those of the signals generated by the primary oscillator 33. However, the frequency is swept in a direction which is opposite to the direction of the frequency-generation of oscillator 33.

In the frequency relationship shown in FIG. 15, the system allows optional frequencies within the desired-channel band of the intermediate frequency band to be replaced by frequencies to be generated by primary oscillator 33. In addition, the system shown in FIG. 15 raises the frequencies to be generated by the primary oscillator 33. This allows the fractional band width to be narrowed, thus making it possible for the system to make up said oscillator 33 easily.

FIG. 16 refers to signals 88 through 91 which are shown in FIG. 14 and a detailed explanation thereof has been omitted.

Primary oscillator 33 generates signals by applying a stationary frequency of a specific intermediate-frequency band. Local oscillator 16 of R-circuit 1 generates signals by sweeping frequencies. Both of the generated signals are mixed together by the sweep-signal generating means 2. The system uses a reference signal which is substantially comprised of the differential signal of the applied frequencies. As a result, R-circuit 1 outputs a specific intermediate-frequency signal containing swept frequencies. The width, velocity, and direction of the swept frequency of the signal generated by the local oscillator 16 and the reference signal are identical to each other.

In the frequency relationship shown in FIG. 16, since primary oscillator 33 generates signals by applying a stationary frequency and generates a reference signal by causing the local oscillator 16 used for channel selection to sweep frequencies, there is no need for synchronizing the signals generated by the primary oscillator 33 and the local oscillator 16. In addition, since stationary frequencies are used for the intermediate-frequency signals, sweep-signal generating means 2 and the intermediate-frequency signal-level detection means 8 can easily be made up.

FIG. 17 refers to signals 88 through 91 which are shown in FIG. 14 and a detailed explanation thereof has been omitted.

Primary oscillator 33 generates signals by applying a stationary frequency of a specific frequency band corresponding to the sum of the desired-channel frequency and the frequency generated by the local oscillator 16, whereas local oscillator 16 of R-circuit 1 generates signals by sweeping frequencies. Both of the generated signals are mixed together by the sweep-signal generating means 2. The differential frequency signal is made available as a reference signal. As a result, R-circuit 1 outputs intermediate-frequency signals containing swept frequencies. The width and velocity of the swept frequencies of signals generated by the local oscillator 16 and the reference signal are identical to each other except for the opposite sweeping direction. The width and velocity of the swept frequencies of the intermediate-frequency signal are double those of the reference signal, while the sweeping directions are opposite from each other.

In the frequency relationship shown in FIG. 17, the primary oscillator 33 generates signals by applying a stationary frequency and generates a reference signal by causing the local oscillator 16 used for channel selection to sweep frequencies. This eliminates the need for synchronizing the signals generated by the primary oscillator 33 and the local oscillator 16, and as a result, the sweep-signal generating means 2 can easily be made up. In addition, since the width of the swept frequency of the intermediate-frequency signal is widened twice, the frequency resolution of the intermediate-frequency signal-level detection circuit 8 is significantly improved.

FIGS. 18 through 26 are respectively the schematic diagrams denoting typically preferred embodiments of the intermediate-frequency signal-level detection circuit 8 of the signal receiver related to the present invention.

In FIG. 18, a specific intermediate-frequency signal generated by the frequency-converted reference signal is first extracted from the signal-switching circuit 4 for delivery to a sampling filter 93, which then filters out only a specific signal containing the desired frequency. This signal is then delivered to a detector 94, which is then converted into a specific DC voltage corresponding to the intermediate-frequency signal level. This voltage is then delivered to an A/D converter 92 before being converted into binary-coded signals that can be processed by the control circuit 9.

When the desired frequency is generated, the control circuit 9 delivers a control signal to the A/D converter 92 so that analog signal can be converted into a digitally encoded signal. Since the circuit shown in FIG. 18 detects the signal level when the desired frequency is reached by controlling the A/D converter 92, the circuit reflecting this embodiment features a simplified constitution compared to the mechanism for switching the sampling filter.

Figure 19:
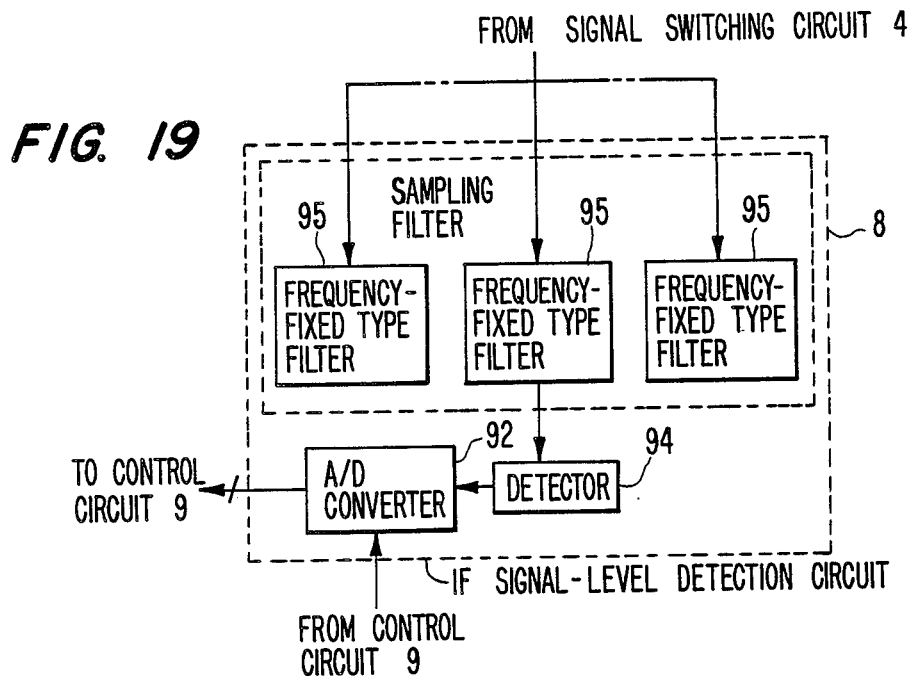
FIG. 19 is a schematic block diagram of the circuit of still another preferred embodiment, in which the sampling filter of a circuit for detecting the signal level of the intermediate frequency is comprised of frequency-fixing filters which are connected to each other in parallel.

FIG. 19 is the schematic block diagram of the intermediate-frequency signal-level detection circuit 8 used for realizing the frequency-relationship explained in the preceding FIGS. 12, 14, 15 and 17. A sampling filter 93 is comprised of a plurality of frequency-fixed type filters 95 compatible with the desired frequencies and connected to each other in parallel, and which sequentially filter out the desired frequencies. The filtered frequencies are delivered to the detector 94, which are then converted into a specific DC voltage corresponding to the needed signal level. Said DC voltage is then delivered to the A/D converter 92 before being converted into binary-coded signals that can be processed by control circuit 9.

When the desired frequencies are reached, the control circuit 9 feeds a control signal to the A/D converter 92 for executing an analog-digital conversion of signals. Since the circuit shown in FIG. 19 detects the signal level when the desired frequencies are reached by controlling the A/D converter without switching the sampling filter, a circuit featuring a simple constitution can easily be made.

Figure 20:
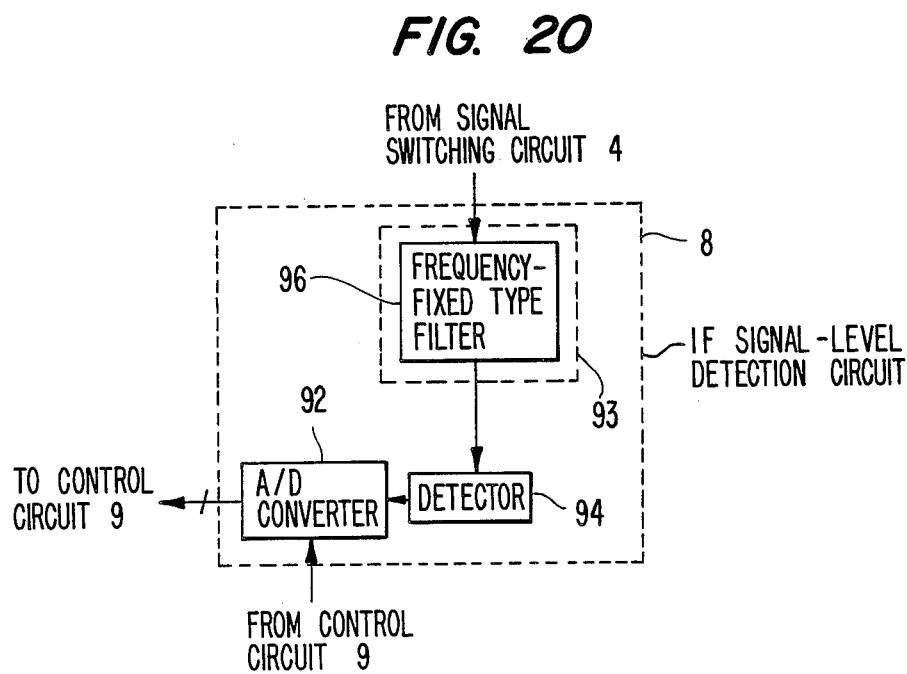
FIG. 20 is a schematic block diagram of the circuit of still another preferred embodiment, in which the sampling filter of a circuit for detecting the signal level of the intermediate frequency is comprised of a fixed frequency filter.

FIG. 20 is the schematic block diagram of the circuit of the intermediate-frequency signal-level detection circuit 8 used for realizing the frequency-relationship explained in conjunction with FIGS. 13 and 16. The sampling filter 93 is comprised of frequency-fixed type filter 96 that samples signals of the fixed frequencies. The filtered frequencies are then delivered to detector 94, which then converts these frequencies into a specific DC voltage corresponding to the needed signal level. Said DC voltage is then delivered to the A/D converter 92 and then converted into a binary-coded signal that can be processed by the control circuit 9. When the reference-signal frequency reaches the desired frequency, the control circuit 9 delivers a control signal to the A/D converter 92 for executing an analog-digital conversion of signals. Since the circuit shown in FIG. 20 detects a signal level when the desired frequency is reached by controlling the A/D converter, a circuit featuring a simple constitution can easily be made up compared to the mechanism for switching the sampling filter. Furthermore, since the sampling filter is substantially comprised of a frequency-fixed type filter, the entire circuit is significantly simplified.

Figure 21:
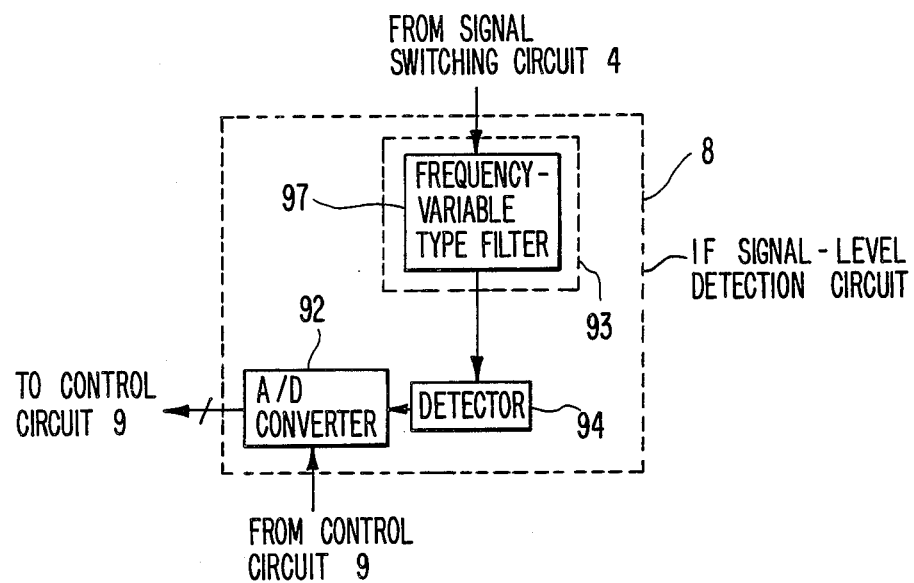
FIG. 21 is a schematic block diagram of the circuit of a still further preferred embodiment, in which the sampling filter of a circuit for detecting the signal level of the intermediate frequency is comprised of variable frequency filter.

FIG. 21 is the schematic block diagram of the circuit of the intermediate-frequency signal-level detection circuit 8 used for realizing the frequency-relationship explained in conjunction with FIGS. 12 through 17. Sampling filter 93 is comprised of a plurality of frequency-variable type filters 97 compatible with the desired frequencies, which sequentially sample signals containing the desired frequencies. The filtered sample signals are then delivered to the detector 94, which are then converted into a specific DC voltage corresponding to the needed signal level before being delivered to the A/D converter which converts the received signal into a binary-coded signal that can be processed by the control circuit 9.

When the desired frequency is reached, the control circuit 9 delivers a control signal to the A/D converter 92 for executing an analog-digital conversion of signals. Since the circuit shown in FIG. 21 detects the signal level when the reference signal is exactly at the desired frequency by controlling the A/D converter, a circuit featuring a simple constitution can easily be made up compared to the mechanism for switching the sampling filter. Furthermore, since the sampling filter 93 is substantially comprised of a frequency-variable filter, even if intermediate-frequency signal uses either a fixed frequency or swept frequency, exactly identical circuitry can be constituted.

Figure 22:
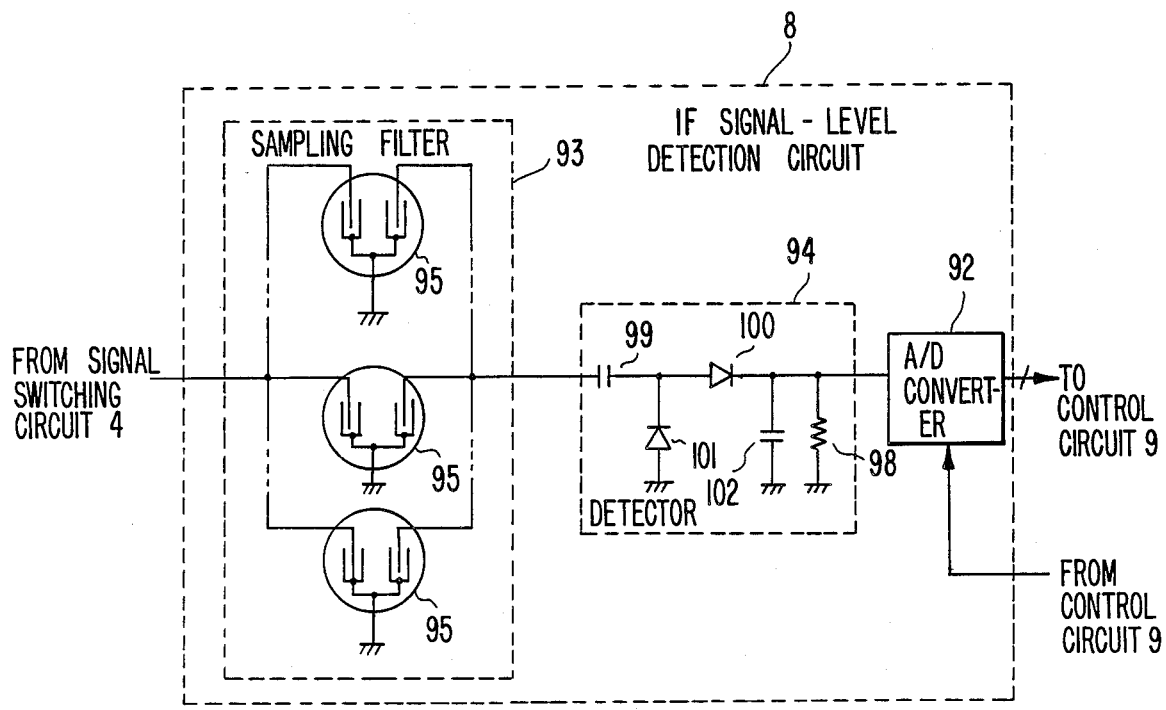
FIG. 22 is a schematic block diagram of the circuit of one of the preferred embodiments, in which the sampling filter of a circuit for detecting the signal level of the intermediate frequency is comprised of a plurality of saw-tooth filters.

FIG. 22 is the schematic block diagram of the circuit of the intermediate-frequency signal-level detection circuit 8 explained in conjunction with FIG. 19. The sampling filter 93 is comprised of a plurality of SAW filters 95, which are respectively provided with characteristics for filtering out only the desired plural frequencies.

The signal-switching circuit 4 delivers a specific intermediate-frequency signal to the intermediate-frequency signal-level detection circuit 8. This signal is then fed to the sampling filter 93, which then filters out a specific intermediate-frequency signal corresponding to the desired plural frequencies of the reference signal. The filtered signal is then delivered to the detector 94, in which the intermediate-frequency signal rectified by diodes 100 and 101 is converted into a specific DC voltage by capacitor 102 and resistor 98. The DC-converted signal is then converted into a binary-coded signal corresponding to said DC voltage by the A/D converter 92 before eventually being delivered to the control circuit 9. The desired frequency is internally detected by said control circuit 9 which feeds a specific tuning voltage to the sweep-signal generating circuit 2 that generates the reference signal. When the desired frequency is reached, the control circuit 9 feeds a control signal to the A/D converter 92, which then receives a specific DC voltage corresponding to the intermediate-frequency signal level for converting it into binary-coded signals. The circuit shown in FIG. 22 detects the signal level when the desired frequency is reached by controlling the A/D converter without switching the sampling filter, thus making it possible for the entire system to make up a significantly simplified circuit constitution.

Figure 23:
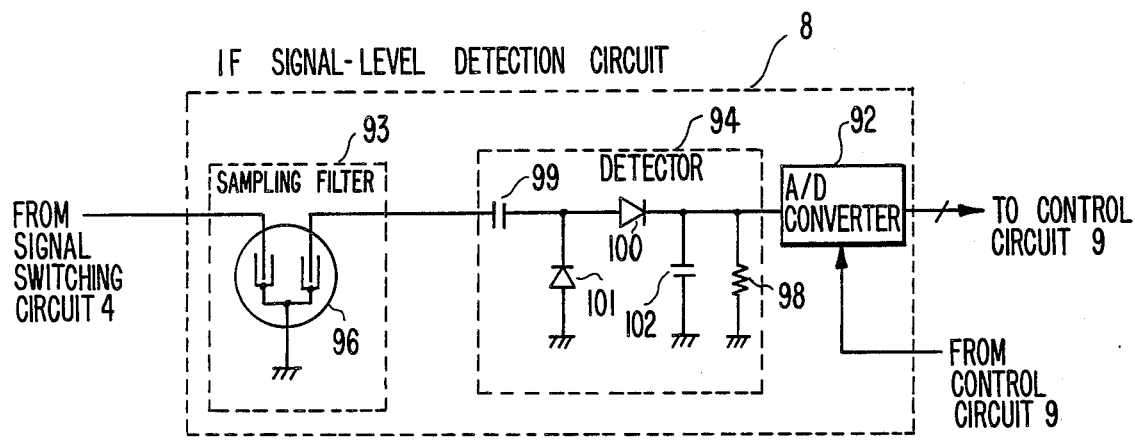
FIG. 23 is a schematic block diagram of the circuit of another preferred embodiment, in which the sampling filter of a circuit for detecting the signal level of the intermediate frequency is comprised of a saw-tooth filter.

FIG. 23 is the schematic block diagram of the circuit of the intermediate-frequency signal-level detection circuit 8 explained in conjunction with the circuit shown in FIG. 20. The sampling filter 93 is comprised of a SAW filter 96 which is provided with characteristics for filtering out the stationary frequency of the intermediate-frequency band. The signal-switching circuit 4 delivers a specific intermediate-frequency signal containing a stationary frequency to sampling filter 93 of the intermediate-frequency signal-level detection circuit 8. The sampling filter 93 filters out all the intermediate-frequency signals compatible with the reference signal containing the desired plural frequencies. The filtered signal is then delivered to the detector 94, where the intermediate-frequency signal rectified by diodes 100 and 101 is converted in to a DC voltage by capacitor 102 and resistor 98. The DC-converted signal is further converted into a binary-coded signal corresponding to the DC voltage by means of the A/D converter 92 before eventually being delivered to the control circuit 9. The desired frequency is internally detected by said control circuit 9 which feeds the tuning signal to the sweep-signal generating circuit 2 generating the reference signal. When the desired frequency is reached, the control circuit 9 delivers a control signal to the A/D converter 92, which then converts the received DC voltage matching the intermediate-frequency signal level into a binary-coded signal. Since the circuit shown in FIG. 23 uses a sampling filter and detects a specific signal level when the desired frequency is reached by controlling the A/D converter, the entire circuit constitution can be simplified significantly.

Figure 24:
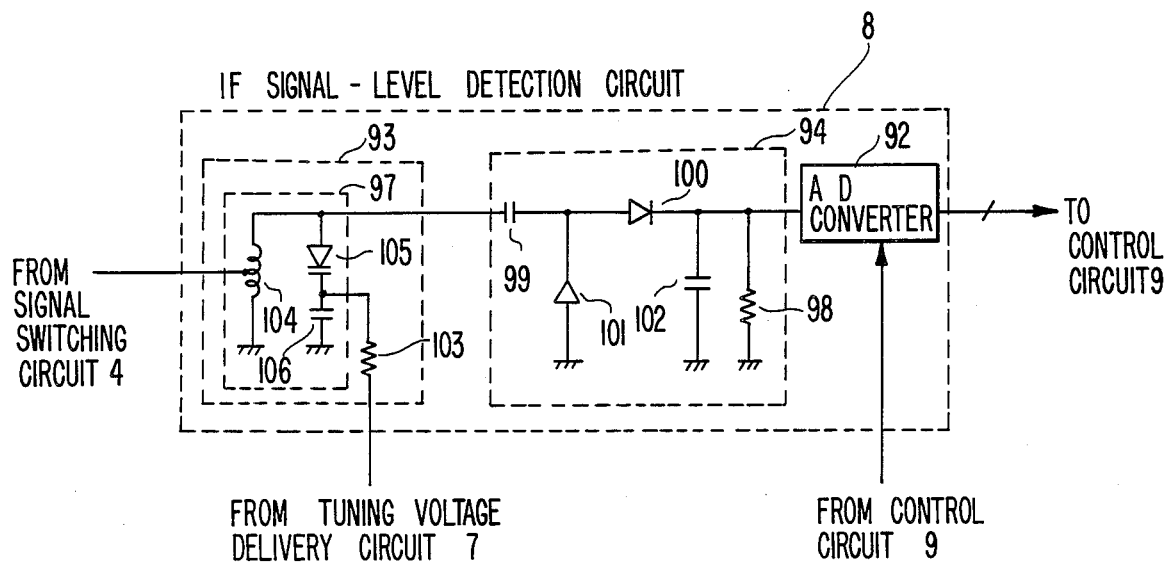
FIG. 24 is a schematic block diagram of the circuit of a still further preferred embodiment, in which the sampling filter of a circuit for detecting the signal level of the intermediate frequency is comprised of windings and varactor diodes.

FIG. 24 is the schematic block diagram of the circuit of the intermediate-frequency signal-level detection circuit 8 explained in conjunction with the circuit shown in FIG. 21. The sampling filter 93 is comprised of a frequency-variable filter 97 which makes up the tuning circuit using a coil 104 and varactor diode 105 used for tuning operation. Said frequency-variable filter 97 feeds a specific tuning voltage to the cathode of varactor diode 105 before filtering out signals containing the desired frequency. The filtered signal is then delivered to the detector 94, where the intermediate-frequency signal rectified by diodes 100 and 101 is converted into a DC voltage by capacitor 102 and resistor 98. The DC-converted signal is further converted into a binary-coded signal corresponding to DC voltage by means of the A/D converter 92 before eventually being delivered to the control circuit 9. The desired frequency of the reference signal is internally detected by said control circuit 9 which feeds the tuning signal to sweep-signal generating circuit 2 generating the reference signal. When the desired frequency is reached, the control circuit 9 delivers a control signal to the A/D converter 92, which then converts the received DC voltage matching the intermediate-frequency signal level into a binary-coded signal. Since the circuit shown in FIG. 24 detects the signal level when the reference signal gains access to the desired frequency by controlling the A/D converter 92, the entire circuit can be significantly simplified as compared to the mechanism for switching the sampling filter. In addition, since the sampling filter 93 is substantially a frequency-variable filter 97, if the intermediate-frequency signal uses either a stationary frequency or the swept frequency, the circuit can be made up using the identical constitution.

Figure 25:
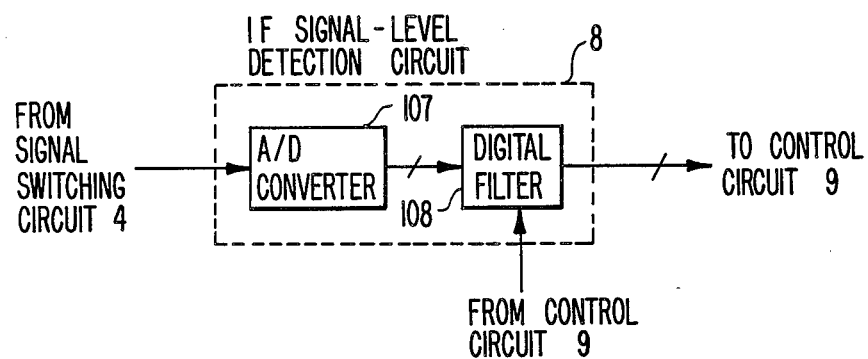
FIG. 25 is a schematic block diagram of the circuit of one of the preferred embodiments, in which a circuit for detecting the signal level of the intermediate frequency is comprised of an A/D converter and a digital filter.

FIG. 25 is the schematic block diagram of the circuit of the intermediate-frequency signal-level detection circuit 8 used for realizing the frequency-relationship explained in the preceding FIGS. 12 through 17. An A/D converter 107 first converts the intermediate-frequency signal output from the signal-switching circuit 4 into binary-coded signals. A digital filter 108 samples only a specific frequency of the intermediate frequency band corresponding to the desired frequency of the reference signal for delivery to the control circuit 9. The circuit shown in FIG. 25 uses a digital filter for sampling signals containing the desired frequency, and thus, it is possible for the entire circuit system to introduce semiconductors, and in addition, the desired frequency can be changed without modifying the circuit constitution.

Figure 26:
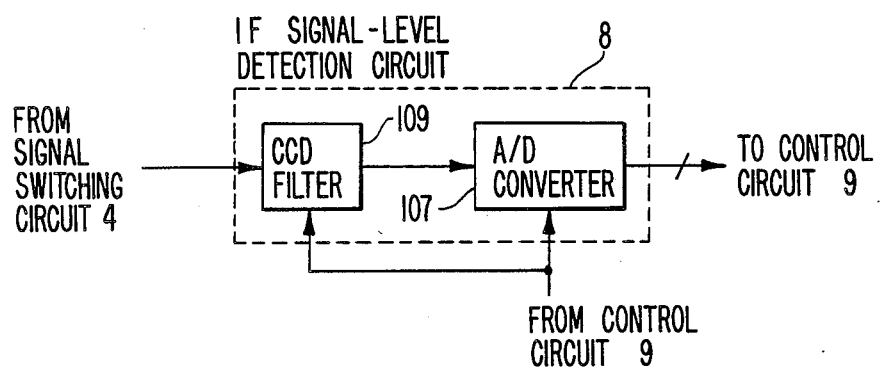
FIG. 26 is a schematic block diagram of the circuit of a still further preferred embodiment, in which a circuit for detecting the signal level of the intermediate frequency is comprised of a CCD filter and an A/D converter.

FIG. 26 is the schematic block diagram of the circuit of the intermediate-frequency signal-level detection circuit 8 used for realizing the frequency-relationship explained in the preceding FIGS. 12 through 17. When the signal-switching circuit 4 outputs an intermediate-frequency signal, a CCD filter 109 first receives a control signal from the control circuit 9 and then samples a specific frequency from the intermediate-frequency band corresponding to the desired frequency of the reference signal. When the A/D converter 107 identifies that the desired frequency is reached, it receives a control signal from the control circuit 9 and converts the sampled signal into a binary-coded signal for delivery to the control circuit 9. The circuit shown in FIG. 26 uses a CCD filter for sampling the desired-frequency signal, and thus, it is possible for the system to introduce semiconductors, and in addition, the desired frequency can be changed without modifying the circuit constitution.

FIGS. 27 and 28 are respectively the schematic block diagrams of the circuits of the tuning-voltage delivery circuit of the signal receiver reflecting other preferred embodiments of the present invention.

As shown in FIG. 27, the tuning-voltage delivery circuit functions as follows. First, the control circuit 9 delivers a control signal that causes the register 112 to remain in the hold condition and the binary-coded signal related to tuning voltage. The control signal causes a register 112 to hold said binary-coded signal related to the tuning voltage. When this signal is delivered to a D/A converter 111 while register 112 is still in the hold condition, the system generates a specific tuning voltage that correctly matches the binary-coded signals in order that the tuning voltage can be delivered to base electrode of the transistor 114 and then to the tuning circuit via resistor 116 by causing transistor 114 to function as an emitter follower. A circuit 117 which is comprised of register 112, D/A converter 111, and transistor 114, is connected to each tuning circuit. Each circuit causes register 112 to hold binary-coded signals related to a tuning voltage in order that these signals can effectively be activated for individually supplying tuning voltages. The reference numeral 110 shown in FIG. 27 denotes the power-supply terminal, whereas the reference numerals 113 and 115 respectively denote bias resistors. The circuit shown in FIG. 27 is provided with a register for each tuning circuit, and as a result, once the binary-coded signal is held by the register 112, the tuning voltage remains constant until changed in the following process. The circuit constitution shown in FIG. 27 is ideally suited for fully introducing semiconductor means.

Next, operations of the circuit of tuning-voltage delivery means shown in FIG. 28 are described below. The control circuit 9 first delivers the control signal for turning a transistor 120 ON and OFF delivers the binary-coded tuning voltage to register 112, while causing register 112 to hold the binary-coded tuning voltage data. When this data is delivered to the D/A converter 111 while said hold-condition is present, the tuning voltage that matches the binary-coded signal is generated, which is then delivered to the base electrode of transistor 114. This causes the emitter electrodes of transistors 114 and 120 to be connected to each other and capacitor 119 to be also connected between the collector electrode transistor 120 and ground. Capacitor 119 is charged while transistor 120 is ON, while it retains the charged voltage while transistor 120 is OFF. As a result, this voltage is supplied to the tuning circuit via resistor 116 as the tuning voltage. A circuit 118 comprised of transistor 120 and capacitor 119 is connected to each tuning circuit. The binary-coded tuning-voltage data is then delivered to register 112, which is then converted into a specific DC voltage by D/A converter 111, and then said DC voltage charges capacitor 119 by provisionally activating transistor 120 of circuit 118 connected to the tuning circuit which needs a specific tuning voltage corresponding to the DC voltage converted by the D/A converter 111. After a specific tuning voltage is delivered to respective tuning circuits, the tuning voltage is again delivered to respective tuning circuits based on the discharge constant shorter than that of capacitor 119 so that the tuning voltage can be prevented from incurring variations. The reference numerals 113, 115 and 121 respectively denote bias resistors. The circuit shown in FIG. 28 allows a specific tuning voltage to be sequentially supplied to respective tuning circuits. As a result, once the tuning voltage is securely held by the register means, variations of the tuning voltage remains at a minimum until the tuning voltage is again changed. In addition, since the circuit shown in FIG. 28 uses units consisting of register and D/A converter which respectively need a number of component elements, and yet, since each tuning circuit uses one transistor and capacitor to make up an extremely simplified constitution, the circuit constitution shown in FIG. 28 is ideally suited for fully introducing semiconductor means.

Figure 29:
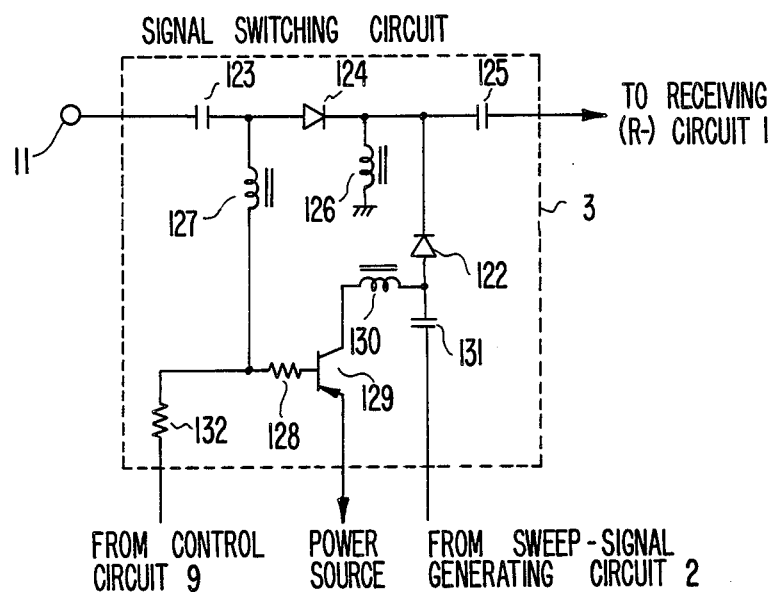
FIG. 29 is a schematic block diagram of the circuit of one of the preferred embodiments, in which the first signal switching circuit is comprised of two diodes.
Figure 30:
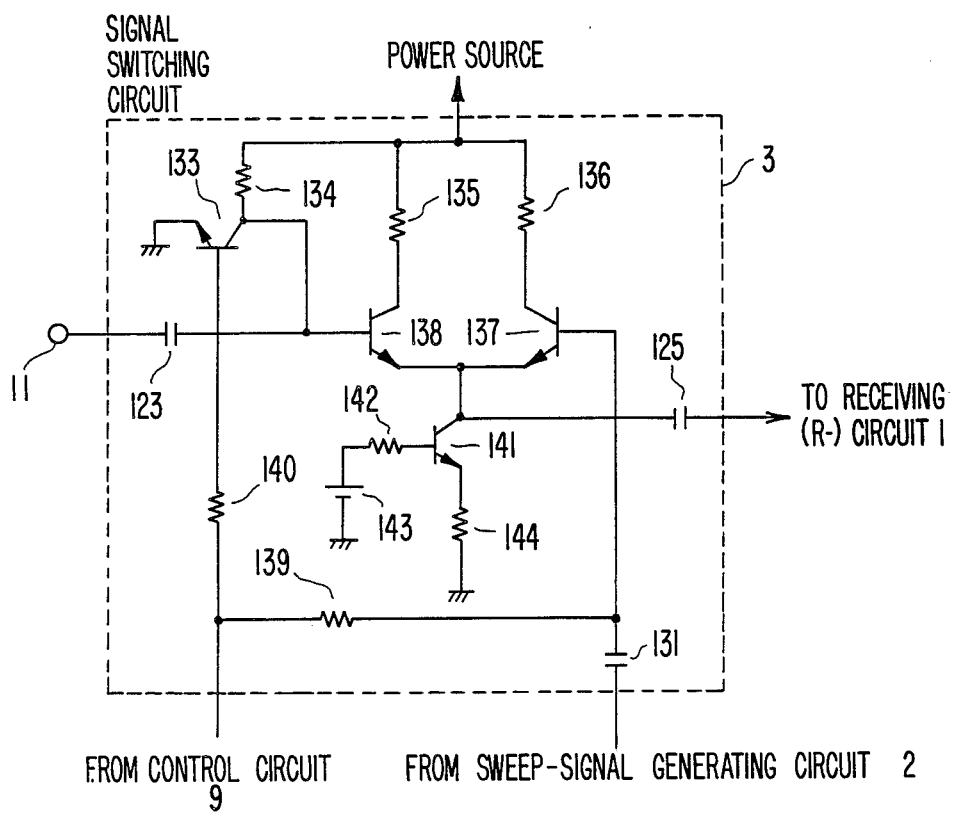
FIG. 30 is a schematic block diagram of the circuit of one of the preferred embodiments, in which the first signal switching circuit is comprised of four transistors.

FIGS. 29 and 30 are respectively the schematic block diagram of the signal-switching circuit 3 of the signal receiver, denoting preferred embodiments of the present invention. In the circuit diagram shown in FIG. 29, the desired-channel signal is received from input terminal 11, which is then delivered to anode of diode 124 via DC-blocking capacitor 123. On the other hand, the reference signal from the sweep-signal generating circuit 2 is delivered to the anode of diode 122 via DC-blocking capacitor 131. The bias current is delivered to the diode 124 via resistors 132 and choke-coils 126 and 127. A resistor 128 is connected to the connection point of choke coil 127 and resistor 132 and to the base electrode of transistor 129. The collector electrode of transistor 129 is connected to the anode of diode 122 via choke coil 130. The cathodes of diodes 122 and 124 are respectively connected to each other, while the choke coil 126 is connected between the contact point of both cathodes and ground. Said contact point is also connected to R-circuit 1 via DC-blocking capacitor 125. Thus, when the control circuit 9 feeds a control voltage that turns transistor OFF, diode 124 becomes conductive and diode 122 non-conductive, allowing the desired-channel signal from terminal 11 to be fed to R-circuit 1. Conversely, when the control circuit 9 delivers a control signal that activates transistor 129, diode 122 becomes conductive and diode 124 non-conductive, thus allowing the sweep-signal generating circuit 2 to deliver a reference signal to R-circuit 1 to implement the switching of signals. The system shown in FIG. 29 features a simplified circuit constitution that effectively switches signals using only two diodes.

Next, operations of the circuit shown in FIG. 30 are described below. The desired-channel signal is received from terminal 11, which is then delivered to the base electrode of transistor 138 via DC-blocking capacitor 123. On the other hand, the sweep-signal generating circuit 2 delivers a reference signal to the base electrode of transistor 137 via DC-blocking capacitor 131. The emitter electrodes of the transistors 137 and 138 are connected to each other, while the connection point of these electrodes is connected to the collector electrode of transistor 141. A constant bias current is delivered to the transistor 141 via constant-voltage-regulated power-supply source 143 and bias resistors 142 and 143, thus making up a constant-current circuit. On the other hand, the control circuit 9 feeds a control signal to the base electrode of transistor 137 via resistor 139. A control signal from the control circuit 9 is also fed to the base electrode of transistor 133 via resistor 140, while the collector electrode of transistor 133 is connected to the base electrode of transistor 138. The collector electrode of said transistor 133 is also connected to the power-supply source via resistor 134. The collector electrode of transistor 141 is connected to R-circuit 1 via a DC-blocking capacitor 125. Consequently, when the control circuit 9 delivers a control voltage to turn transistor 133 OFF, the collector potential of said transistor 133 rises to turn transistor 138 ON and transistor 137 OFF, thus allowing the desired-channel signal from terminal 11 to be delivered to R-circuit 1. Conversely, the control circuit 9 delivers a control voltage that activates transistor 129, transistor 138 turns OFF and transistor 137 turns ON, thus allowing the reference signal from the sweep-signal generating circuit 2 to be delivered to R-circuit 1 so that signal switching can be implemented. Since the circuit shown in FIG. 30 merely uses transistors and resistors to make up the entire constitution, this system is ideally suited for fully introducing semiconductor means to make up an integrated circuit.

Figure 31:
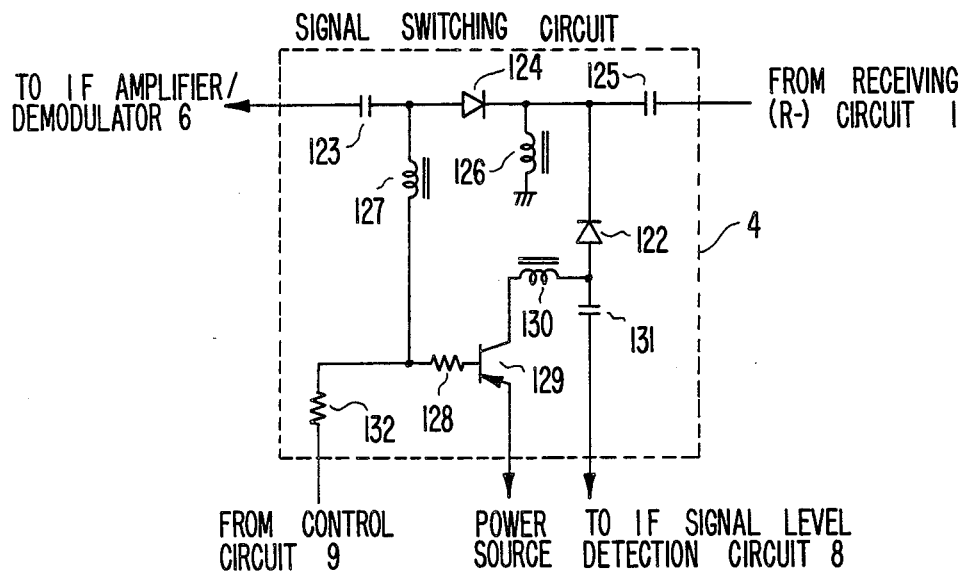
FIG. 31 is a schematic block diagram of the circuit of one of the preferred embodiments, in which the second signal switching circuit is comprised of two diodes.
Figure 32:
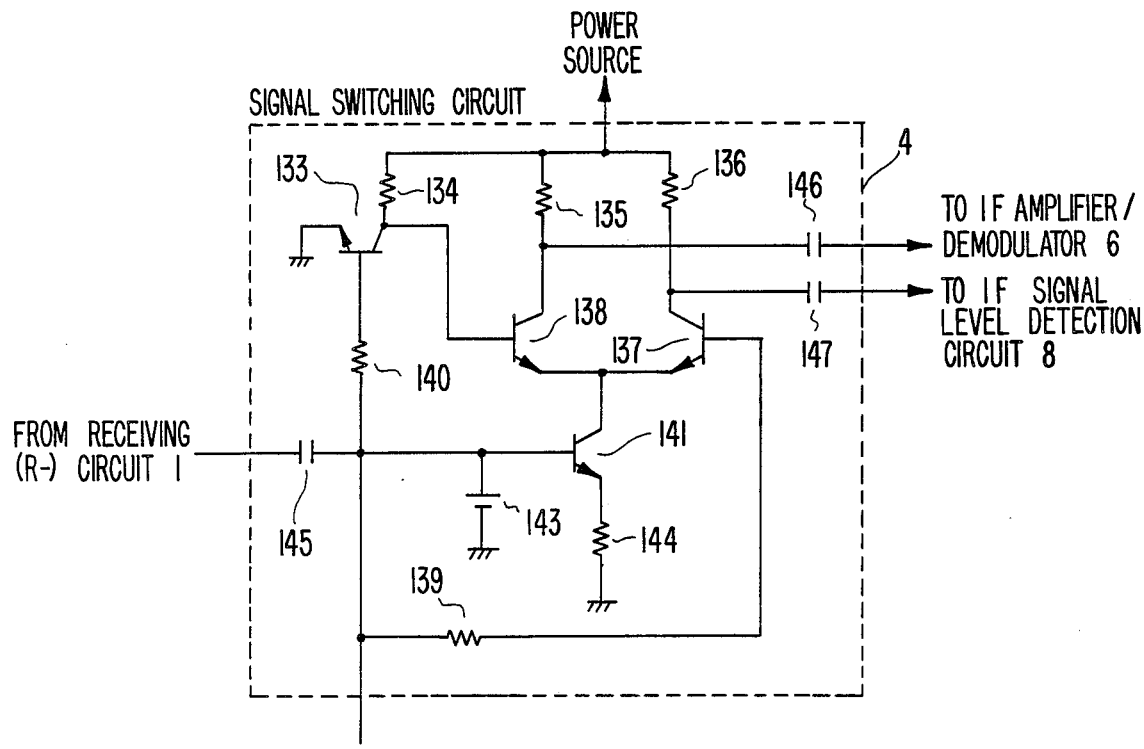
FIG. 32 is a schematic block diagram of the circuit of one of the preferred embodiments, in which the second signal switching circuit is comprised of four transistors.

FIGS. 31 and 32 are respectively the schematic block diagrams of the signal-switching circuit of the signal receiver, reflecting preferred embodiments of the present invention. As shown in FIG. 31, the intermediate-frequency signals from R-circuit 1 are first delivered to the cathode of diode 122 via DC-blocking capacitor capacitor 125. The anode of diode 124 is connected to the intermediate-frequency amplifier/demodulator 6 via DC-blocking capacitor 123, whereas the anode of diode 122 is connected to the intermediate-frequency signal-level detection circuit 8 via DC-blocking capacitor 131. The diode 124 receives a bias current from resistor 132 and choke-coils 126 and 127. The resistor 128 is connected to the connection point between choke-coil 127 and resistor 132 and also to the base electrode of transistor 129. The collector electrode of transistor 129 is connected to the anode of diode 122 via choke coil 130. The cathodes of diodes 122 and 124 are connected to each other, while the choke coil 126 is connected between the connection point of these cathodes and ground. Consequently, when the control circuit 9 delivers a control signal that turns transistor 129 OFF, the diode 124 becomes conductive and diode 122 non-conductive thus allowing the intermediate-frequency signal from R-circuit 1 to be delivered to the intermediate-frequency amplifier/demodulator 6 via DC-blocking capacitor 123. Conversely, when the control circuit 9 delivers a control signal that activates transistor 129, the diode 122 becomes conductive and diode 124 non-conductive. This allow the intermediate-frequency signal from R-circuit 1 to be delivered to the intermediate-frequency signal-level detection circuit 8 via DC-blocking capacitor 131 so that signal switching can be implemented. The circuit shown in FIG. 31 executes switching of signals by applying only two diodes, thus featuring an extremely simplified constitution.

As shown in FIG. 32, the intermediate-frequency signal from R-circuit 1 is first delivered to the base electrode of the transistor 141 via DC-blocking capacitor 145. The collector electrode of the transistor 138 is connected to the intermediate-frequency amplifier/-demodulator 6 via DC-blocking capacitor 146. On the other hand, the collector electrode of the transistor 137 is connected to the intermediate-frequency signal-level detection circuit 8 via DC-blocking capacitor 147. The emitter electrodes of said transistors 137 and 138 are connected to each other. The connection point of these emitter electrodes is connected to the collector electrode of transistor 141 which receives a constant bias current from a constant-voltage-regulated power-supply source 143 and bias resistor 144, thus making up a constant-current circuit. On the other hand, the control circuit 9 delivers a control signal to the base electrode of the transistor 137 via resistor 139, while the control signal from the control circuit 9 is also delivered to the base electrode of transistor 133 via resistor 140. The collector electrode of transistor 133 is connected to the base electrode of the transistor 138. The collector electrode of the transistor 133 is connected to the power-supply source via resistor 134. On the other hand, the collector electrode of the transistor 141 is connected to R-circuit 1 via DC-blocking capacitor 125. Consequently, when the control circuit 9 outputs a control voltage that turns transistor 133 OFF, the collector potential rises to turn transistor 138 ON and turn transistor 137 OFF, thus allowing the intermediate-frequency signal from R-circuit 1 to be delivered to the intermediate-frequency amplifier/demodulator 6 via DC-blocking capacitor 146. Conversely, when the control circuit 9 delivers a control voltage activating transistor 129, transistor 138 turns OFF and transistor 137 turns ON to allow the intermediate-frequency signal from R-circuit 1 to be delivered to the intermediate-frequency signal-level detection circuit 8 via DC-blocking capacitor 147 so that a signal switching operation can eventually be implemented. The circuit shown in FIG. 32 merely uses transistors and resistors to make up the entire constitution, and thus, this circuit system is ideally suited for implementing an integrated circuit by fully introducing semiconductor means.

Figure 33:
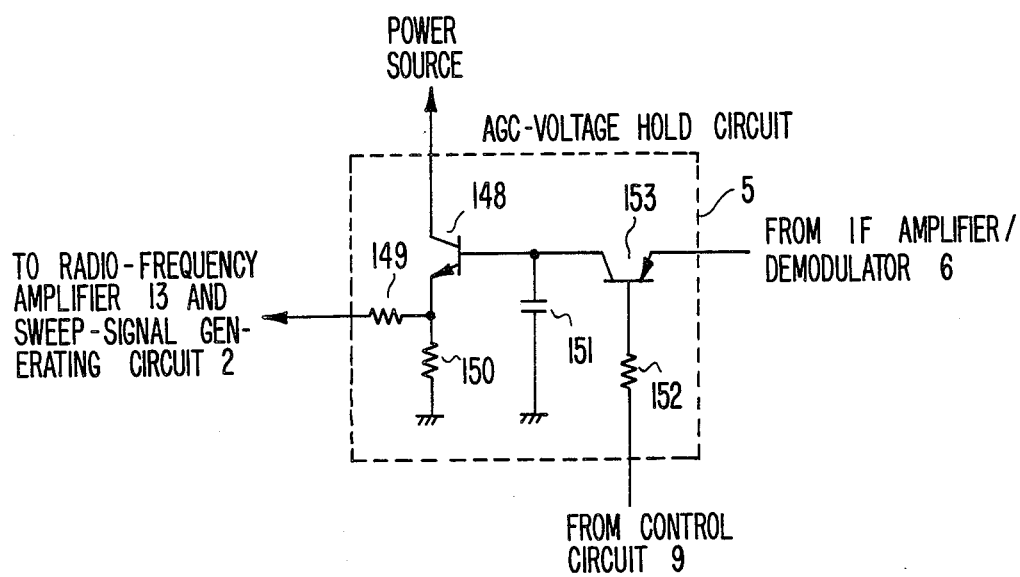
FIG. 33 is a schematic block diagram of the circuit of one of the preferred embodiments, in which the AGC voltage retention circuit is comprised of two transistors and a capacitor.
Figure 34:
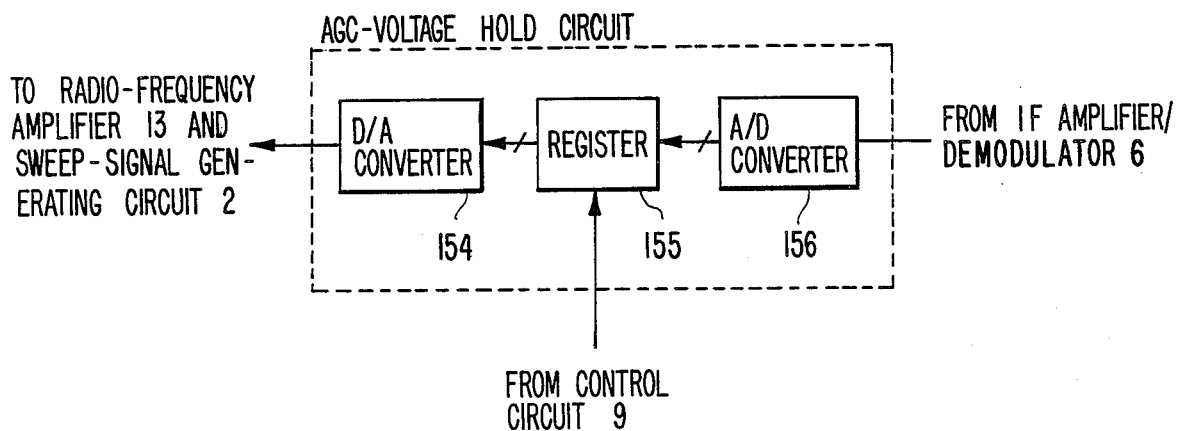
FIG. 34 is a schematic block diagram of the circuit of one of the preferred embodiments, in which the AGC voltage retention circuit is comprised of a D/A converter, a resistor and an A/D converter.

FIGS. 33 and 34 are respectively the schematic block diagrams of AGC-voltage hold circuits of the signal receiver reflecting still further preferred embodiments of the present invention. As shown in FIG. 33, the AGC voltage output from the intermediate-frequency amplifier/demodulator 6 is first delivered to the emitter electrode of the transistor 153 which turns ON and OFF in response to the control signal from the control circuit 9. While receiving the desired-channel signal, transistor 153 remains activated. This transistor however remains OFF until the tuning voltages are eventually set after completing delivery of the channel-select signal from the channel-select circuit to the control circuit 9. While transistor 153 is ON, capacitor 151 is charged with a specific DC voltage proportional to the AGC voltage. When transistor 153 is OFF, the AGC-voltage hold circuit holds the voltage immediately before transistor 153 turns OFF. Capacitor 151 delivers its voltage to the base electrode of transistor 148, while this voltage is also delivered to a radio-frequency amplifier 13 and the sweep-signal generating circuit 2 via resistor 149 from the emitter electrode of said transistor 148 acting as an emitter-follower. Consequently, while transistor is ON, the AGC voltage which is varied by the control signal from the control circuit 9 is delivered to the radio-frequency amplifier 13 and the sweep-signal generating circuit 2. When transistor 153 is OFF, the AGC-voltage hold circuit holds a specific AGC voltage which was present immediately before transistor 153 turns OFF. This allows the system to feed a constant voltage to the radio-frequency amplifier 13 and the sweep-signal generating circuit 2. The circuit shown in FIG. 33 securely holds a specific AGC voltage using two transistors and a capacitor, thus greatly helps promote the simplification of the circuit constitution.

As shown in FIG. 34, a specific AGC voltage output from the intermediate-frequency amplifier/demodulator 6 is first converted into a binary-coded signal by an A/D converter 156, which is then delivered to a register 155 to securely maintain the status of register 155. Thus, when holding the AGC voltage constant, the contents of said register 155 is retained. A data signal output from register 155 is converted into an analog voltage by a D/A converter 154, which is then delivered to the radio-frequency amplifier 13 and sweep-signal generating circuit 2. The circuit system shown in FIG. 34 uses register means that hold the binary-coded AGC voltage data. This circuit effectively prevents the retained AGC-voltage from varying due to varying environmental conditions.

Figure 35:
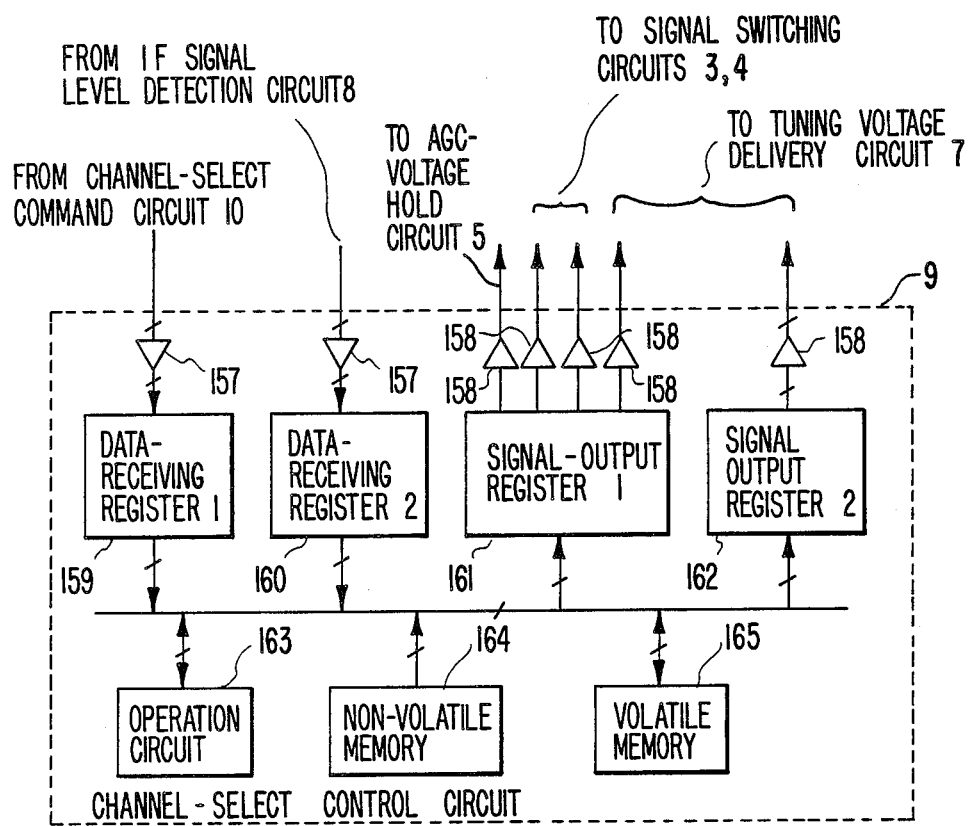
FIG. 35 is a simplified block diagram of the circuit making up control circuit.

FIG. 35 is the simplified block diagram of a control circuit of the signal receiver reflecting preferred embodiments of the present invention. The tuning control procedure for operating the signal receiver related to the present invention is converted into binary-coded data, which is stored in a non-volatile memory 164. All the system elements function in accordance with these data related to the established tuning control procedure. The binary-coded channel-control signal output from the channel-select command circuit 10 is delivered to a data-receiving register(1) 159 through an input-buffering gate 157. On the other hand, in accordance with the tuning control procedure, an operation circuit 163 first reads the contents of the data-receiving register(1) 159 and then delivers the binary-coded tuning voltage data signal to a signal-output register(2) 162, which then outputs this data signal to the local oscillator 16, the input tuning circuit 12 and the interstage tuning circuit 14 via an output-buffer gate 158. The tuning voltage data delivered to these circuits is stored in a volatile memory 165. Next, the control circuit delivers a binary-coded control signal to a signal-output register(1) 161. This controls AGC-voltage hold circuit 5 for maintaining the AGC voltage constant. The control circuit then delivers a binary-coded control signal to the signal-output register(1) 161 for switching the signal-switching circuits 3 and 4. Then, the control circuit delivers a tuning voltage to a signal-output register(2) 162 for delivery to the sweep-signal generating circuit 2. The control circuit also delivers a control signal to the signal-output register(1) 161 for controlling the sweep-signal generating circuit 2. These signals from the control circuit are respectively delivered to the sweep-signal generating circuit 2 via the output-buffer gate 158. The selection of the respective tuning circuits, and the delivery and fine variation of the tuning voltage are executed in the same manner as described above.

Next, an intermediate-frequency signal output from R-circuit 1 is converted into binary-coded signals by the intermediate-frequency signal-level detection circuit 8 before being delivered to the signal-input register(2) 160 via the input-buffer gate 157. An operation circuit 163 then compares the binary-coded intermediate-frequency signal to the desired frequency characteristics and then varies the tuning voltage so that the best frequency characteristics can be generated by executing sequential operations identical to those which are described above. When the optimum frequency characteristics are achieved, the control circuit causes a non-volatile memory 164 to store the data related to the tuning voltage delivered to the respective tuning circuits. The control circuit then sets the signal-switching circuits 3 and 4 and the AGC-voltage hold circuit 5 to the status of correctly receiving the desired-channel signal.

The circuit shown in FIG. 35 easily varies the tuning control procedure merely by changing the content of the non-volatile memory. The circuit shown here is ideally suited for making up an integrated circuit by fully introducing semiconductor means.

Figure 36:
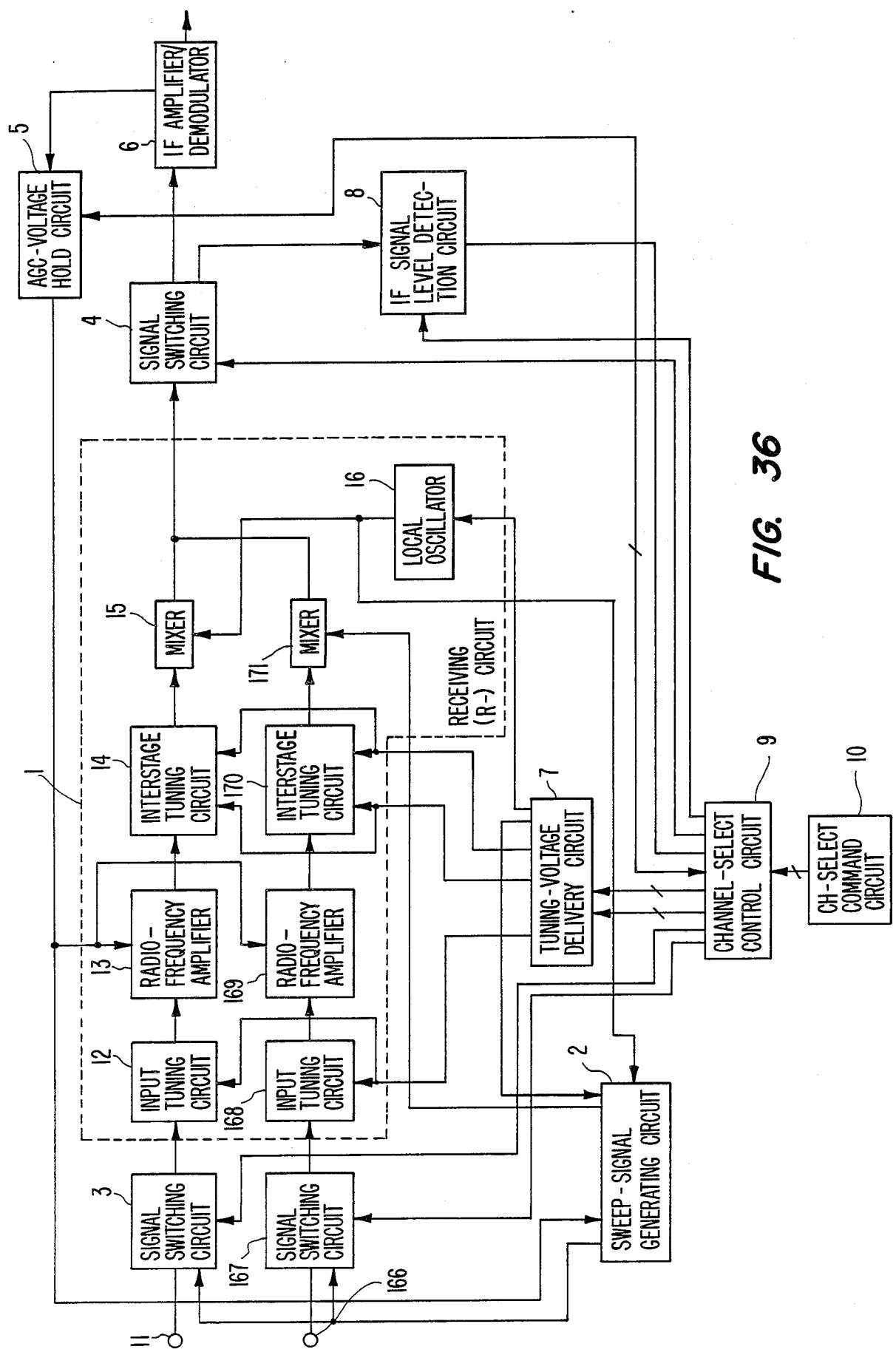
FIG. 36 is a simplified block diagram of the circuit of one of the preferred embodiments, in which the primary oscillator is made available for another local oscillator.

FIG. 36 is the simplified block diagram of the entire circuit of the signal receiver, denoting the third preferred embodiment of the present invention. The terminal 116 receives those signals which are in a specific frequency band different from those channel band delivered to terminal 11. The signal-switching circuits 3 and 167, the input-tuning circuits 12 and 168, the radio-frequency amplifiers 13 and 169, the interstage tuning circuits 14 and 170, and the mixers 15 and 171, are respectively provided with an identical constitution. Using signals generated by the local oscillator 16, the desired-channel signal from terminal 11 is converted into an intermediate-frequency signal by the mixer 15. Likewise, using signals generated by the oscillator of the sweep-signal generating circuit 2, the desired-channel signal from terminal 116 is converted into an intermediate-frequency signal by the mixer 171.

Consequently, when receiving the desired-channel signal from terminal 11, the local oscillator 16 is made available for selecting the desired channel. Conversely, when receiving the desired-channel signal from terminal 116, the oscillator of sweep-signal generating circuit 2 is used so that it functions as the local oscillator itself, whereas the local oscillator 16 itself is made available for use as the oscillator of the sweep-signal generating circuit 2. The circuit constitution denoting the third preferred embodiment of the present invention shown in FIG. 36 eliminates the need for providing an additional oscillator for generating a reference signal needed for controlling the tuning voltage of the receiver unit receiving a signal of a plurality of frequency bands. In addition, since a local oscillator which is not used for channel-selection is made available, as compared to the circuit of the second preferred embodiment, the circuit constitution shown in FIG. 36 can be significantly simplified.

What is claimed is:

1. A signal receiving apparatus comprising:
 a receiver part for converting a radio-frequency signal to an intermediate-frequency signal by using a local oscillator signal generated by a local oscillator included therein;
 a reference signal generating means for generating a reference signal;
 a means for applying said reference signal to said receiver part as said radio-frequency signal;
 a frequency characteristic changing means for changing a frequency characteristic of said receiver part;
 a means for controlling at least one of said reference signal generating means and said local oscillator so as to sweep a frequency of at least one of said reference signal and said local oscillator signal within a predetermined frequency range so that the frequency characteristic of said receiver part appears as a response of said intermediate-frequency signal to the frequency-swept signal;
 a detecting means for detecting levels of said intermediate-frequency signal corresponding to a plurality of frequencies within said predetermined frequency range to obtain the frequency characteristic of said receiver part; and
 a means for comparing the frequency characteristic of said receiver part obtained by said detecting means with a desired frequency characteristic to obtain an error therebetween and for controlling said frequency characteristic changing means to change the frequency characteristic of said receiver part to reduce said error until said error is substantially eliminated, whereby said receiver part is set to substantially have said desired frequency characteristic.

2. An apparatus as in claim 1, wherein said receiver part had an amplifier for amplifying said radio-frequency signal, and wherein said apparatus further comprises a means for fixing a gain of said amplifier.

3. A signal receiver apparatus comprising:
 a receiver part for converting a radio-frequency signal to an intermediate-frequency signal, comprising at least one tuning circuit for tuning a frequency of said radio-frequency signal, a local oscillator for generating a local oscillator signal, and a mixer for mixing the frequency-tuned radio-frequency signal and said local oscillator signal to obtain said intermediate-frequency signal;
 a reference signal generating means for generating a reference signal;
 a means for applying said reference signal to said receiver part as said radio-frequency signal;
 a voltage delivery means for delivering voltages to said tuning circuit to change a frequency characteristic of said receiver part and to at least one of said reference signal generating means and said local oscillator to sweep a frequency of at least one of said reference signal and said local oscillator signal within a predetermined frequency range so that the frequency characteristic of said receiver part appears as a response of said intermediate-frequency signal to the frequency-swept signal;
 a detecting means for detecting levels of said intermediate-frequency signal corresponding to a plurality of frequencies within said predetermined frequency range to obtain the frequency characteristic of said receiver part; and
 a means for comparing the frequency characteristic of said receiver part obtained by said detecting means with a desired frequency characteristic to obtain an error therebetween and for controlling said voltage delivery means to change the frequency characteristic of said receiver part to reduce said error until said error is substantially eliminated, whereby said receiver part is set to substantially have said desired frequency characteristic.

4. An apparatus as in claim 3, wherein said receiver part further comprises an amplifier for amplifying said radio-frequency signal, and wherein said apparatus further comprises a means for fixing a gain of said amplifier.

5. An apparatus as in claim 3, wherein said reference signal generating means comprises an oscillator whose oscillation frequency is controlled by a voltage supplied from said voltage delivery means within a frequency band of said radio-frequency signal.

6. An apparatus as in claim 3, wherein said reference signal generating means comprises an oscillator for generating an oscillator signal whose frequency is controlled by a voltage supplied from said voltage delivery means, and a mixer for mixing said oscillator signal and said local oscillator signal generated by said local oscillator in said receiver part to obtain said reference signal.

7. An apparatus as in claim 6, wherein said oscillator in said reference signal generating means oscillates within a frequency band of said intermediate-frequency signal.

8. An apparatus as in claim 6, wherein said oscillator in said reference signal generating means oscillates within a sum of a frequency band of said intermediate-frequency signal and the frequency of said local oscillator signal.

9. A signal receiving apparatus comprising:
 a receiver part for converting a radio-frequency signal to an intermediate-frequency signal by using a local oscillator signal generated by a local oscillator included therein;
 an input terminal for receiving a selected channel signal;
 a reference signal generating means for generating a reference signal;
 a first switching means for selecting one of said input terminal and said reference signal generating means to selectively pass one of said selected channel signal and said reference signal to said receiver part as said radio-frequency signal;
 a voltage delivery means for delivering voltages to said receiver part to change a frequency characteristic of said receiver part and to at least one of said reference signal generating means and said local oscillator to change a frequency of at least one of said reference signal and said local oscillator signal;
 a demodulating means for demodulating said intermediate-frequency signal;

a detecting means for sequentially detecting levels of said intermediate-frequency signal;

a second switching means for selecting one of said demodulating means and said detecting means to selectively pass said intermediate-frequency signal from said receiver part to one of said demodulating means and said detecting means; and a control means for controlling said first and second switching means, said voltage delivery means and said detecting means;

wherein said control means first controls said first and second switching means to respectively select said reference signal generating means and said detecting means, and thereafter controls said voltage delivery means and said detecting means in such a sequence of:

controlling said voltage delivery means to sweep the frequency of at least one of said reference signal and said local oscillator signal within a predetermined frequency range so that the frequency characteristic of said receiver part appears as a response of said intermediate-frequency signal to the frequency-swept signal, while controlling said detecting means to sequentially detect levels of said intermediate-frequency signal corresponding to a plurality of frequencies within said predetermined frequency range to obtain the frequency characteristic of said receiver part;

comparing the obtained frequency characteristic of said receiver part with a desired frequency characteristic to obtain an error therebetween; and controlling said voltage delivery means to change the frequency characteristics of said receiver part so that said error is reduced, and wherein said control means repeats said sequence until said error is sequentially eliminated, whereby said receiver part is set to substantially have said desired frequency characteristic, said control means thereafter controlling said first and second switching means to respectively select said input terminal and said demodulating means.

10. An apparatus as in claim 9, further comprising a means for fixing a level of said reference signal at substantially the same level as a level of said selected channel signal.

11. An apparatus as in claim 9, wherein said receiver part has an amplifier for amplifying said radio-frequency signal, and wherein said apparatus further comprises a means for fixing a gain of said amplifier.

12. An apparatus as in claim 9, further comprising an AGC voltage holding means for holding an AGC voltage generated at said demodulating means before said first and second switching means are switched to respectively select said reference signal generating means and said detecting means, wherein said receiver part has an amplifier for amplifying said radio-frequency signal, and the held AGC signal is applied to said amplifier to fix a gain of said amplifier.

13. An apparatus as in claim 12, wherein said held AGC voltage is further applied to said reference signal generating means to fix a level of said reference signal at substantially the same level as said selected channel signal.

14. An apparatus as in claim 9, wherein said reference signal generating means comprises an oscillator whose oscillation frequency is controlled by a voltage supplied from said voltage delivery means within a frequency band of said selected channel signal.

15. An apparatus as in claim 9, wherein said reference signal generating means comprises an oscillator for generating an oscillator signal whose frequency is controlled by a voltage supplied from said voltage delivery means, and a mixer for mixing said oscillator signal and said local oscillator signal generated by said local oscillator in said receiver part to obtain said reference signal.

16. An apparatus as in claim 15, wherein said oscillator in said reference signal generating means oscillates with a frequency band of said intermediate-frequency signal.

17. An apparatus as in claim 15, wherein said oscillator in said reference signal generating means oscillates within a sum of a frequency band of said intermediate-frequency signal and the frequency of said local oscillation signal.

18. A signal receiving apparatus comprising:

a receiver part comprising a first part for converting a first radio-frequency signal to an intermediate-frequency signal by using a first local oscillator signal generated by a first oscillator, and a second part for converting a second radio-frequency signal to said intermediate-frequency signal by using a second local oscillator signal generated by a second oscillator;

a mixing means for mixing said first and second local oscillator signals to obtain a reference signal;

a means for applying said reference signal selecting to one of said first and second parts of said receiver part as said first and second radio-frequency signals, respectively;

a frequency characteristic changing means for changing a frequency characteristic of each of said first and second parts of said receiver part;

a means for controlling at least one of said first and second oscillators to sweep a frequency of said reference signal and a frequency of at least one of said first and second local oscillator signals within a predetermined frequency range;

a detecting means for sequentially detecting levels of said intermediate-frequency signal corresponding to a plurality of frequencies within the predetermined frequency range to obtain the frequency characteristic of each of said first and second parts of said receiver part; and a means for comparing the frequency characteristic obtained by said detecting means with a desired frequency characteristic to obtain an error therebetween and for controlling said frequency characteristic of each of said first and second parts so that said error is reduced until said error is substantially eliminated, whereby each of said first and second parts of said receiver part is set to substantially have said desired frequency characteristic.

* * * * *